United States Patent [19]

Biegon et al.

[11] Patent Number: 4,647,844
[45] Date of Patent: Mar. 3, 1987

[54] METHOD AND APPARATUS FOR TESTING SHIELDED CABLE ASSEMBLIES

[75] Inventors: Robert J. Biegon, Aurora; John W. Kincaid, Jr.; Leonard J. Visser, both of Batavia, all of Ill.

[73] Assignee: Cooper Industries, Inc., Houston, Tex.

[21] Appl. No.: 637,752

[22] Filed: Aug. 3, 1984

[51] Int. Cl.$^4$ ............................................. G01R 27/04
[52] U.S. Cl. ................................. 324/57 R; 324/58 R
[58] Field of Search ............ 324/57 R, 57 N, 57 DE, 324/52, 58 R, 58 A, 58 B, 58 C

[56] References Cited

U.S. PATENT DOCUMENTS

| | | |
|---|---|---|
| 2,043,528 | 6/1936 | Davis . |
| 2,499,759 | 3/1950 | Kempf . |
| 2,852,737 | 9/1958 | Wheeler . |
| 3,289,074 | 11/1966 | Jones . |
| 3,337,551 | 4/1968 | LeDoux . |
| 3,462,682 | 8/1969 | Burnett et al. . |
| 3,803,484 | 4/1974 | Gray . |
| 3,839,672 | 10/1974 | Anderson ........................ 324/58 A |
| 3,952,245 | 4/1976 | Miller .............................. 324/57 R |
| 4,263,549 | 4/1981 | Toppeto ........................... 324/57 N |
| 4,278,933 | 7/1981 | Klopach ........................... 324/58 R |
| 4,425,542 | 1/1984 | Tsaliovich ........................ 324/58 R |
| 4,463,309 | 7/1984 | Crochet ............................ 324/57 R |
| 4,471,294 | 9/1984 | Nielsen ............................ 324/58 R |

Primary Examiner—Reinhard J. Eisenzopf
Assistant Examiner—Jose M. Solis
Attorney, Agent, or Firm—Fitch, Even, Tabin & Flannery

[57] ABSTRACT

An automatic cable assembly testing apparatus and procedure. The connectors at each end of a cable assembly are isolated from the cable and from a test source. Each connector is then injected with a plurality of test frequencies and the leakage currents sensed for each of these tests. The leakage current for a particular test is compared against a corresponding reference level and pass/fail lamps are used to provide a visual indication of the test results. The sequence of tests for each end of a cable assembly over a range of frequencies can either be accomplished either automatically or manually. The preferred embodiment illustrates a microprocessor based controller for operating the system.

19 Claims, 16 Drawing Figures

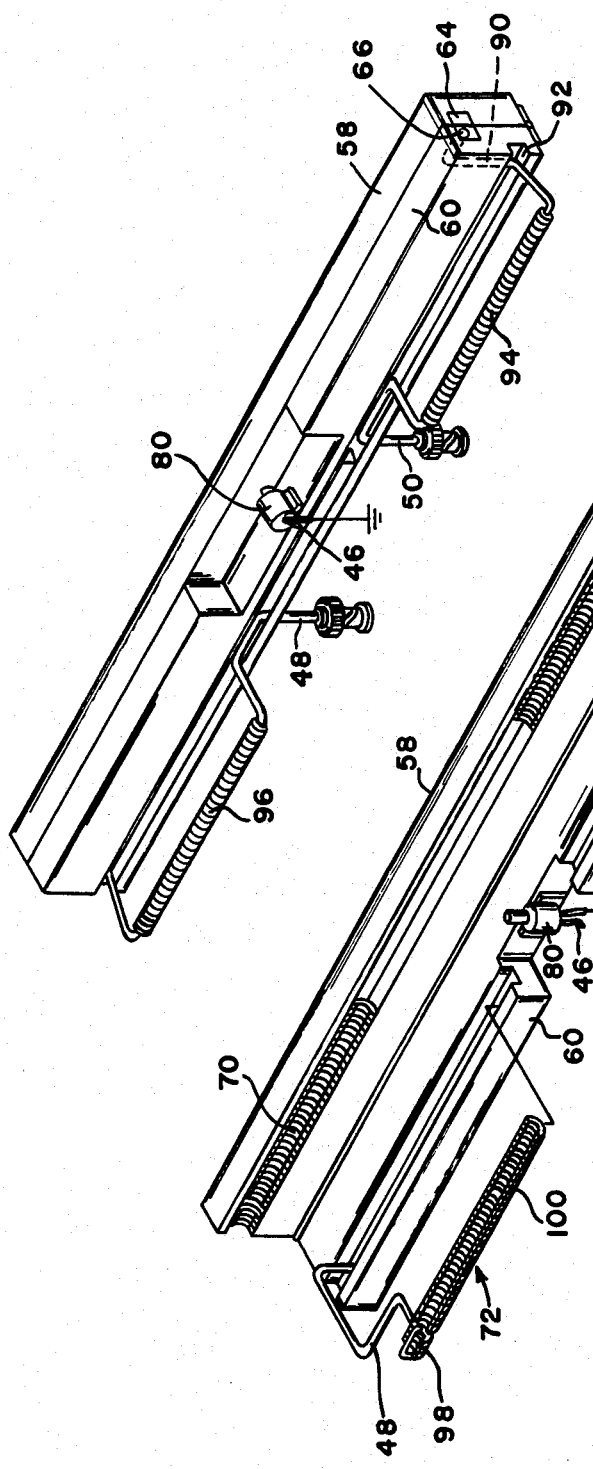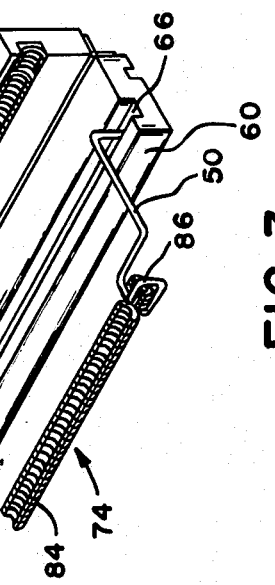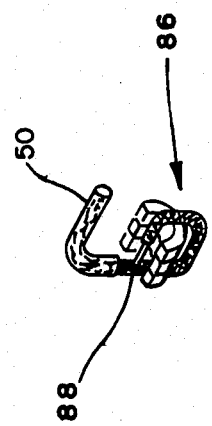

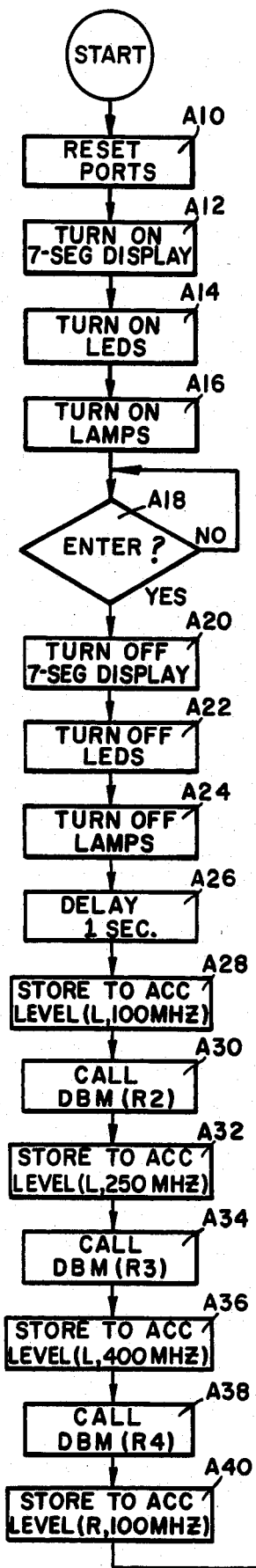
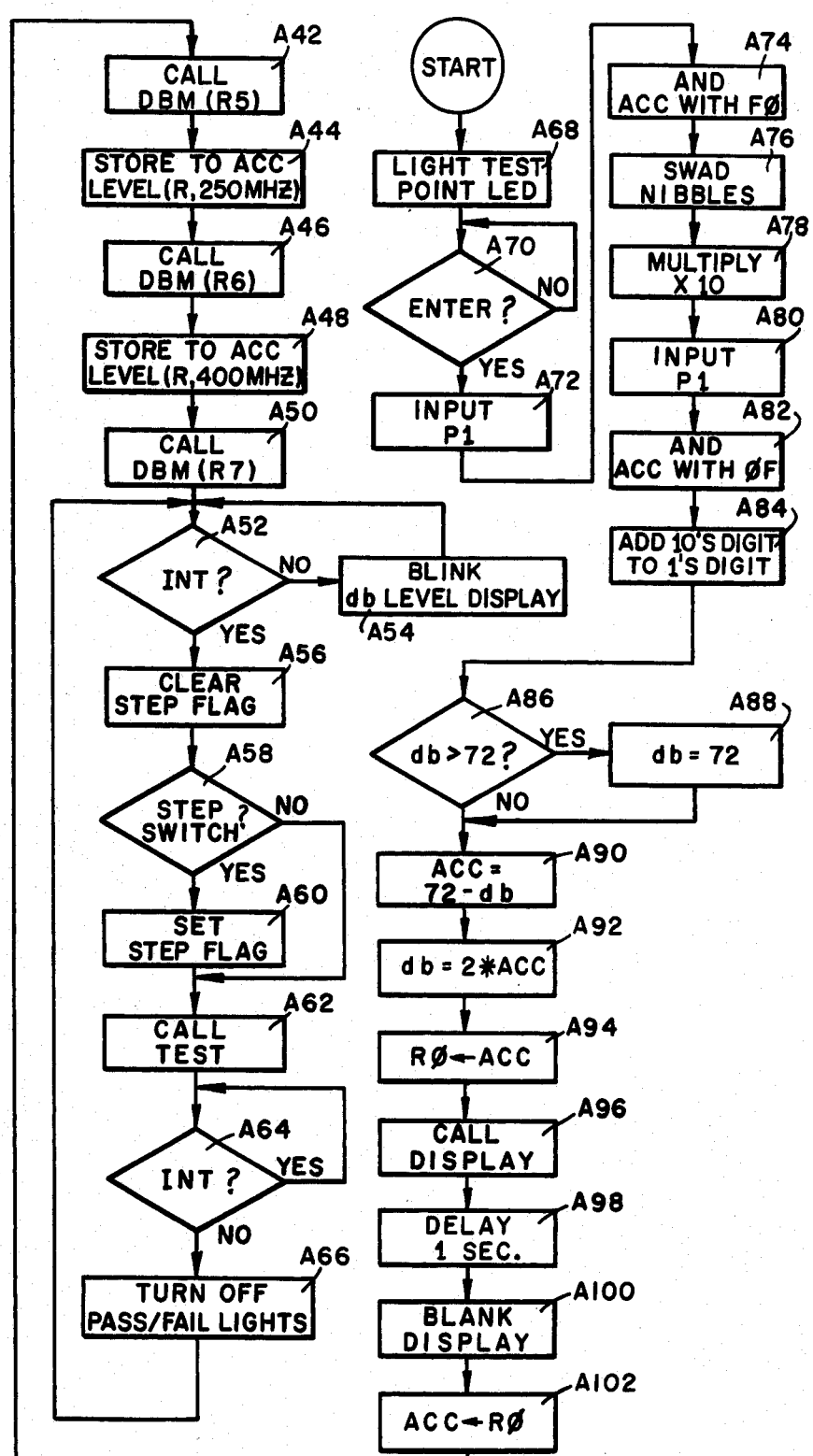
FIG. 8
FIG. 10

| 400 | 250 | 100 | R | L | J3 | J2 | J1 | HEX | COMMAND |
|---|---|---|---|---|---|---|---|---|---|
| 1 | 1 | 0 | 1 | 0 | 0 | 0 | 0 | D0 | LEDS (L,100MHZ) ON |
| 1 | 0 | 1 | 1 | 0 | 0 | 0 | 0 | B0 | LEDS (L,250MHZ) ON |
| 0 | 1 | 1 | 1 | 0 | 0 | 0 | 0 | 70 | LEDS (L,400MHZ) ON |
| 1 | 1 | 0 | 0 | 1 | 0 | 0 | 0 | C8 | LEDS (R,100MHZ) ON |
| 1 | 0 | 1 | 0 | 1 | 0 | 0 | 0 | A8 | LEDS (R,250MHZ) ON |
| 0 | 1 | 1 | 0 | 1 | 0 | 0 | 0 | 68 | LEDS (R,400MHZ) ON |
| 1 | 1 | 0 | 1 | 0 | 0 | 0 | 1 | D1 | SELECT J1 AND LEDS(L,100HZ) |
| 1 | 0 | 1 | 1 | 0 | 0 | 1 | 0 | B2 | SELECT J2 AND LEDS(L,250HZ) |
| 0 | 1 | 1 | 1 | 0 | 1 | 0 | 0 | 74 | SELECT J3 AND LEDS(L,400HZ) |
| 1 | 1 | 0 | 0 | 1 | 0 | 0 | 1 | C9 | SELECT J1 AND LEDS(R,100HZ) |
| 1 | 0 | 1 | 0 | 1 | 0 | 1 | 0 | AA | SELECT J2 AND LEDS(R,250HZ) |
| 0 | 1 | 1 | 0 | 1 | 1 | 0 | 0 | 6C | SELECT J3 AND LEDS(R,400HZ) |
| 1 | 1 | 1 | 1 | 1 | 0 | 0 | 0 | F8 | ALL OFF |
PORT 21
FIG. 9
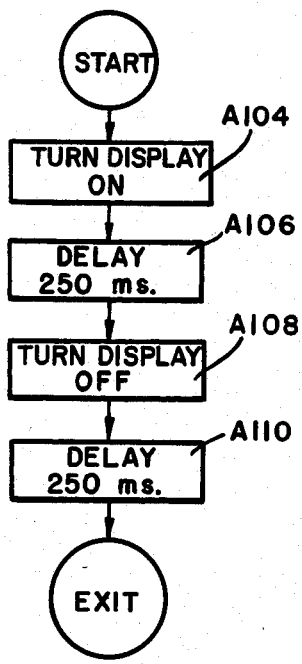
FIG. 11
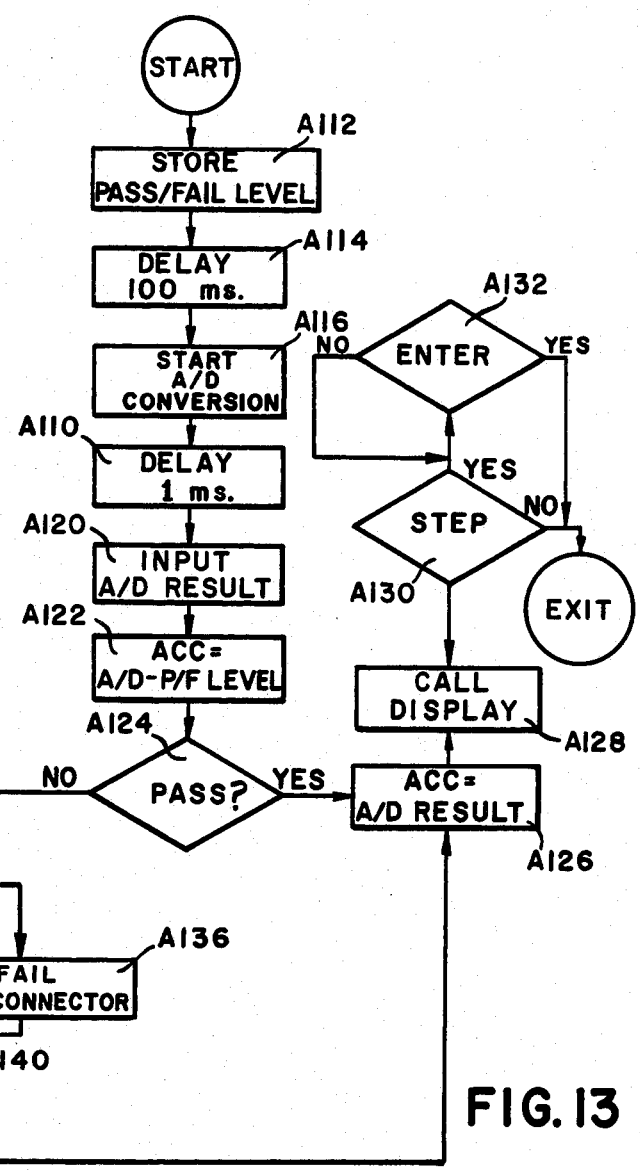
FIG. 13

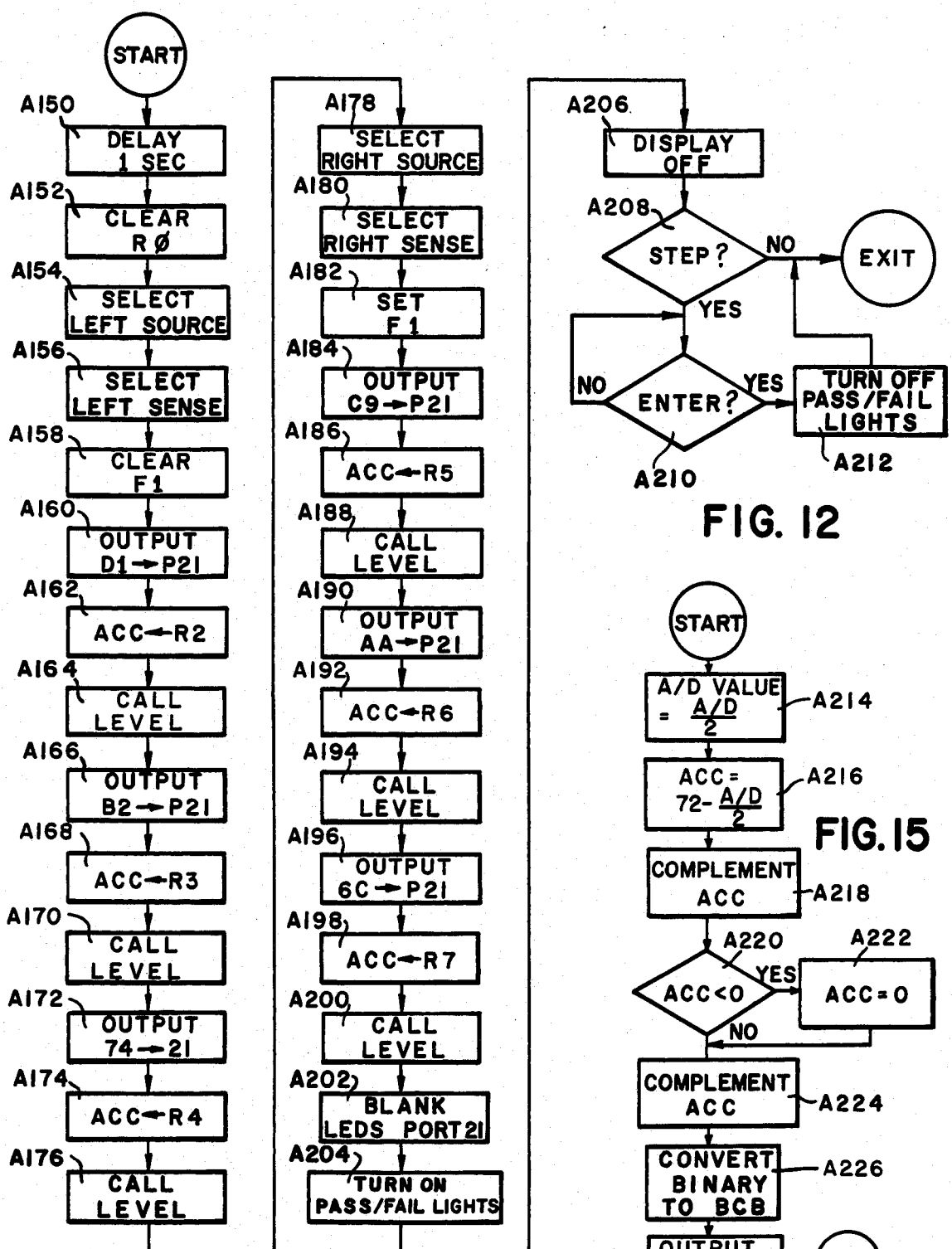

METHOD AND APPARATUS FOR TESTING SHIELDED CABLE ASSEMBLIES

The invention pertains generally to a method and apparatus for testing shielded cable assemblies and is more particularly directed to an automated test apparatus which can test the integrity of a connector shield at either end of a cable assembly.

In the data processing and computer control field when information is transferred between processors, or between a processor and a peripheral device, it conventionally is communicated by means of a shielded I/O cable assembly. A cable assembly of this type consists of a length of shielded cable which is terminated on either end by a shielded connector. The connectors at each end of the assembly can be the same or different, depending upon the interface needs of the system being connected.

The cable and connectors are shielded for at least two reasons, both of which are related to the high speed digital data which is being transmitted through the assembly. First, the data being transmitted through the cable assembly creates electrical and magnetic fields (EMI) which if not shielded from the other computer equipment could cause loss of data in the memories of these devices. There are strict standards for the amount of EMI that can be generated by a device in the computer field and thus, assemblies without adequate shielding cannot be used for these purposes if their radiated emissions are greater than a certain amount. Such standards are imposed by Governmental agencies, for example, the Federal Communications Commission, industrial agencies, and even specific customers.

Further, these shielded cables may be used in an environment where the electrical and magnetic fields are such that if given the opportunity to interact with the fields of the cable assembly, could cause a disruption of the communication or faulty data transmission. Thus, a shielded cable can be used in a noisy environment to ensure that high speed digital data can be transferred between devices without compromising its integrity.

A cable connector is usually comprised of a shell or connector body which interfaces the individual conductors of the cable to predetermined connector pins which mate with pins of an oppositely posed connector of the device being joined. The connector also includes a connector shield to dissipate any electro-magnetic interference at the connector shell. The cable comprises the individual conductors and insulation which are surrounded by a cable shield. The most critical areas for guarantying shield integrity for the cable assembly are the interfaces or mechanical connections between the connector shield and connector shell and the connector shield and the cable shield. Should these interfaces exhibit a high impedance characteristic over certain portions of the RF frequency band, the result could be leakage of the fields of the cable into the environment and a high level of EMI. Additionally, such high impedance paths could create a entry point for outside electrical and magnetic fields to enter the cable assembly.

In general, the high impedance interfaces are due to poor bonding between the conductive elements forming the separate shields. Poor bonding can be the result of procedures in the manufacturing process when improper techniques and materials are used. Otherwise, poor interface bonding may appear in cable assemblies over a extended period of time as a result of such environmental conditions as temperature-humidity cycling, vibration, flexing, or chemical corrosion. Whatever the reason for these leakage paths, the EMI that these high impedance interfaces generate can cause a cable assembly to be unacceptable in a digital communications environment.

The injection of a radio frequency into a cable during manufacture to test the strength of its shielding has been been previously accomplished by others such as apparatus shown in U.S. Pat. No. 3,839,672 issued to Anderson and U.S. Pat. No. 3,803,484 issued to Grey. The apparatus test single conductor shielded cable and not the multiconductor cables of an assembly terminated at each end by a connector. Thus, the art is deficient of a method and apparatus for testing the shield effectiveness of a cable assembly.

It would be highly advantageous to provide a device for testing such assemblies either in a production environment, for in-service testing of assemblies, or for design evaluation in the laboratory. The difficulty with providing such a testing apparatus include being able to measure the shielding effectiveness against a reference for different lengths of a cable assembly and for different connectors on the ends of a cable assembly. Further, there exists a problem of how to separate the measurement of the shielding effectiveness of the cable shield from the shielding effectiveness of the connector shields and their interfaces.

SUMMARY OF THE INVENTION

The invention provides a method and apparatus for evaluating the effectiveness of the shielding of a cable assembly. The effectiveness of a connector shield at either end of the cable assembly can be evaluated along with the effectiveness of the interfaces between the connector shields and the cable shield.

The apparatus includes a means for injecting one connector of a cable assembly with a radio frequency test signal while terminating the other end of the cable assembly; means for electrically isolating the injection means and the other end of the cable assembly from the injected connector; means for sensing a radio frequency leakage signal radiated on the surface of the cable assembly shield located between the isolation means; and means for comparing the leakage signal with a threshold and for generating a pass/fail signal indicating whether the leakage signal is in excess of the threshold.

In the illustrative embodiment the isolation is performed by a shielded adapter box having a connector mating with the injected connector at one end of the cable assembly thereby isolating the injection means from the connector and a test fixture having an toroidal shield for isolating the other end of the cable assembly from the injected connector. The adapter box is fed with a radio frequency test signal which transmits it through to the connector and between the connector and the isolation means on the other end of the cable assembly, is located a sensing means which detects RF leakage due to the defects in the shielding of the injected connector and its interface with the cable assembly shield. A similar arrangement allows the opposite end of the cable assembly to be tested for the effectiveness of its shield and its connector termination point.

A microprocessor based control selects which cable connector is injected and tested by the RF frequency. Further, the control provides for a selection from several frequencies for use in the injection and thereby several tests of a connector at the different frequencies.

The testing of each cable connector termination point by several frequencies is equivalent to sweeping a frequency range containing the several test frequencies. Thus, an overall shielding characteristic can be developed over this range of frequencies. Advantageously, the several frequencies which cover the range are chosen such that common failure modes of the tested cable assemblies will be sure to fail at least one test frequency.

One of the more important advantages of a cable assembly testing apparatus constructed in this manner is the directivity and localization of the tested area. The arrangement of the sensors and isolation means creates a directive measurement device which can separate a connector shield evaluation at one end of the assembly from the effects produced by the cable shield and the other connector. This directive characteristic is also advantageous in eliminating the effects on a test calibration reference level if the cable assemblies are not of the same length.

Such an arrangement permits the shielding effectiveness at one end of the assembly to be tested against a reference developed for the particular type of connector terminating that end. Thus, the device contemplates using different reference levels for the type of connector terminating each end even if they are different from the other and for different reference levels for each of the test frequencies.

These and other objects, features and advantages of the invention will become more fully apparent and clearly understood from a reading of the following detailed description with reference to the accompanying drawings in which:

BRIEF DESCRIPTION OF THE DRAWINGS

FIG. 3 is a perspective view, partially disassembled, illustrating the test fixture apparatus for the testing system illustrated in FIG. 1;

FIG. 4 is a bottom perspective view, partially disassembled, of the test fixture apparatus for the testing apparatus illustrated in FIG. 1;

FIG. 5 is an enlarged perspective view of a current sensor used in the test fixture apparatus illustrated in FIGS. 1, 2, 3 and 4;

FIG. 8 is a detailed flow chart of the program stored within the microprocessor illustrated in FIG. 7;

FIG. 9 is a pictorial representation in tabular form of the commands producing selection of the test frequencies and test points for the output port shown in FIG. 7;

FIG. 10 is a detailed flow chart of the subroutine DBM which is called from the main routine illustrated in FIG. 8;

FIG. 11 is a detailed flow chart of the subroutine BLINK which is called by the main routine illustrated in FIG. 8;

FIG. 12 is a detailed flow chart of the subroutine TEST called by the main routine illustrated in FIG. 8;

FIG. 13 is detailed flow chart of the subroutine LEVEL called from the subroutine TEST illustrated in FIG. 12;

FIG. 14 is a pictorial representation of the register RO illustrating the pass/fail flags stored therein;

FIG. 15 is a detailed flow chart of the subroutine DISPLAY which is called by the subroutines DBM and LEVEL.

DETAILED DESCRIPTION OF THE PREFERRED EMBODIMENT

Figure 1:
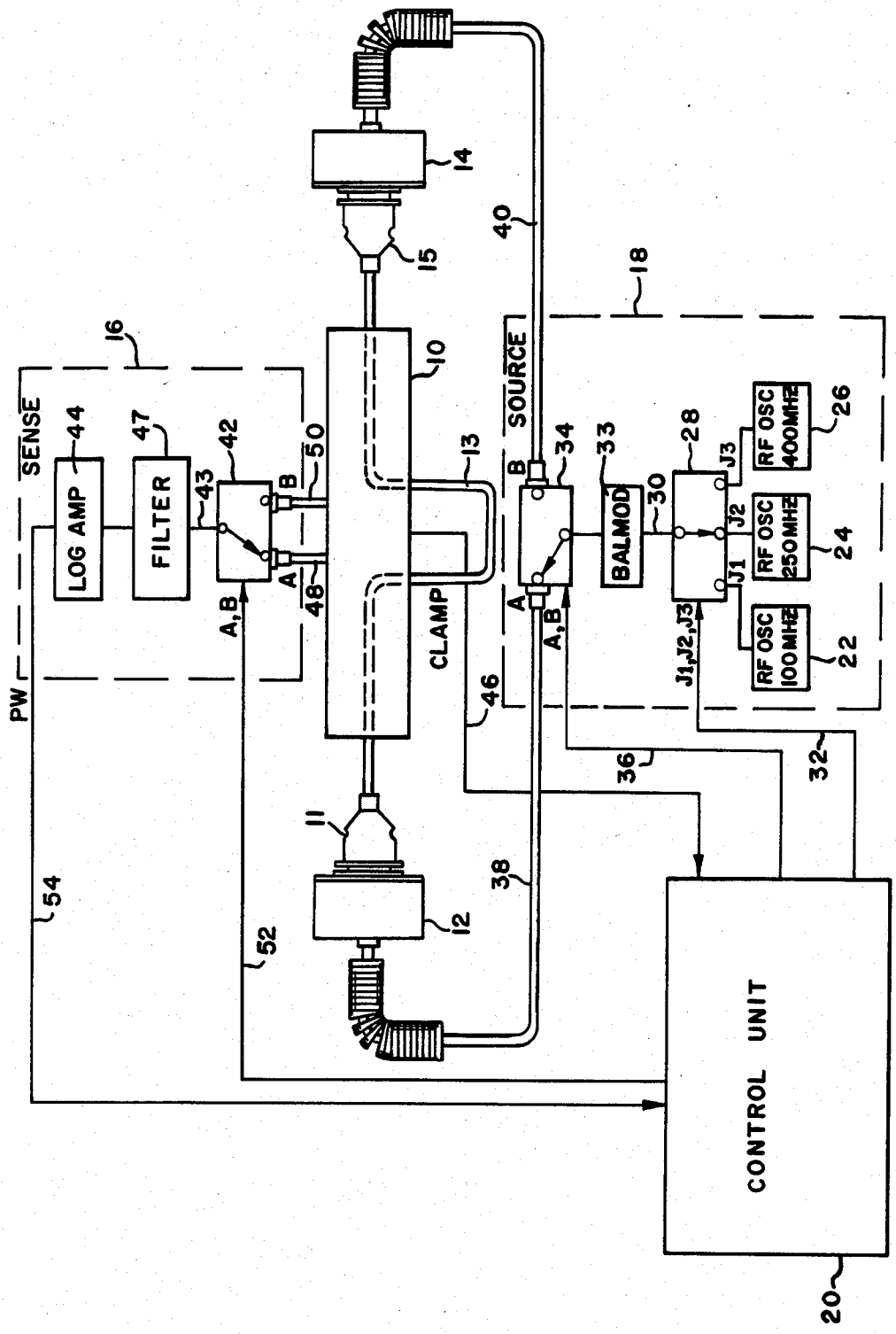
FIG. 1 illustrates a system block diagram of an apparatus for testing shielded cable assemblies constructed in accordance with the invention.

FIG. 1 shows a system diagram of a shielded cable assembly test apparatus constructed in accordance with the invention. The apparatus includes generally a test fixture 10 and adapter boxes 12 and 14. Tested within the fixture 10 is a shielded cable assembly comprising a connector 11, a cable 13, and a connector 15. The cable 13 is a multiconductor shielded cable terminated on either end by the shielded connectors 11, 15. The shields of the connectors and cable are electrically coextensive and comprise one shield by their junction at several interfaces. The adapter boxes 12, 14 provide oppositely posed connectors into which connectors 11, 15 can be plugged. Further, the test apparatus comprises a sense circuit 16 for receiving RF leakage signals sensed by current sensors of the test fixture 10. The leakage signals are the result of injected RF frequencies from a source circuit 18 which provides a test signal for the cable assembly. The sense circuit 16 and source circuit 18 are controlled by a microprocessor based control unit 20 which directs the injected frequency into one end or the other of the cable assembly through cables 38, 40 and senses the leakage currents from the injected end of the assembly through cables 48, 50.

The source circuit 18 includes a plurality of RF frequency oscillators 22, 24 and 26 which can be connected selectively to a coaxial cable node 30 by means of a coaxial cable switch 28. The microprocessor based control unit 20 selects which RF oscillator output is connected to the node by generating control signals J1, J2 and J3 via signal line 32. If the J1 signal is generated then a 100 MHz injection frequency is coupled to the node 30, while if the J2 signal is generated a 250 MHz signal is coupled to the node 30. When the J3 signal is generated, the coaxial switch will connect the 400 MHz signal from oscillator 26 to the node 30. Thus, the control unit 20 can selectively couple any of the injection frequencies to the node 30 and thus sweep over the range of those frequencies for test purposes. It is readily evident that by this type of digital control that a sweep of more than three frequencies or a continuous sweep of a range of frequencies can be made available for test purposes.

The common coaxial output node 30 of the switch 28 is input to a balanced modulator 33. The balanced modulator 33 superimposes on the selected RF test frequency an amplitude modulation of approximately 17 KHz. The modulation is combined with the test frequency for the purpose of providing the sense circuit with a means to reject RF signals picked up by the sensors which are not due to the injection of the test frequencies. The 17 KHz frequency is not critical and other frequencies and even other types of modulation can be used to differentiate the test signals from other RF signals which may be present in the environment. The choice of the AM frequency should be such to make it unlikely that a similar AM modulation would be found from a common RF source, such as a carrier of a UHF broadcast station, in the test frequency range of 100–500 MHz. If the power levels received at the sense circuit are due only to the injected test frequencies then a much more precise comparison can be accomplished. Preferably, the balanced modulator can comprise a modulating amplifier commercially available from the Motorola Corp. of Schaumberg, Ill. as Model No. MHW 590.

The output of the balanced modulator 33 is switchable between two outputs A, B of a second coaxial switch 34 by means of control signals A, B generated over signal line 36 by the control unit 20. Output A is a coaxial coupler which carries the RF test signal through cable 38 to the adapter box 12. Output B is a coaxial coupler which transmits the RF test frequency through cable 40 to the adapter box 14. The test frequencies are transmitted through the adapter boxes and applied to the connectors of the cable assembly. When a test frequency has been selected by a control signal A, B, the other unconnected output is terminated with a nominal impedance, for example, 50 ohms, by switch 34. Terminating the unconnected outputs of switch 34 in the same impedance removes another source of error from the measurement of the leakage signal.

The control unit 20 by selectively generating the control signals A, B, J1, J2, and J3 can therefore control the direction of an injected test frequency either to connector 11 or connector 15, and the frequency thereof by selecting the particular RF oscillator source. The signals A, B therefore control the direction of the injected test frequency and the signals J1, J2, and J3 control the value of the source frequency selected.

Sense circuit 16 is comprised of a coaxial switch 42 which has two inputs A, B which are coupled to coaxial cables 48 and 50, respectively. The coaxial cables 48 and 50 carry RF leakage signals from current sensors as will be more fully explained hereinafter. Power values for the leakage signals in excess of a specified attenuation characteristic are the result of faulty cable connector shielding or interface connection shielding which has been sensed as a result of the injection of the source test frequencies. The coaxial cable 48 receives the leakage signal for the end of the cable assembly coupled to adapter box 12 and the coaxial cable 50 receives the leakage signal for the end of the cable assembly coupled to adapter box 14.

The inputs A, B of the coaxial switch 42 are switchable to a common output 43 which is coupled to a filter 47 and a logarithmic amplifier 44. The filter 47 selects those RF signals having the 17 KHz modulation thereon and then removes the modulation from the test frequency. The amplifier 44 is termed logarithmic because its gain varies as the $\log_{10}$ of the voltage input thereby producing a conversion of the leakage signals into their power equivalents. The power level output from the logarithmic amplifier 44 is referenced to 1 milliwatt and is given in −dbmw. This signal is output as a DC voltage level because of an internal detection circuit which rectifies the described sensed RF leakage signals. A logarithmic amplifier having the capabilities is commercially available from RHG Electronics of Deerpark, N.Y., as Model No. ICLW 300 and has a frequency range of 100–500 MHz. The selection of which input is coupled to the amplifier 44 is provided by control signals A, B via signal line 52 from the control unit 20. The output of the amplifier 44, a power signal Pw, is received by the control unit 20 over signal line 54. Thus, the sense circuit 16 and control signals A, B provide a means for sensing the leakage current from at either connector side shielded cable assembly 11, 13, and 15.

Figure 2:
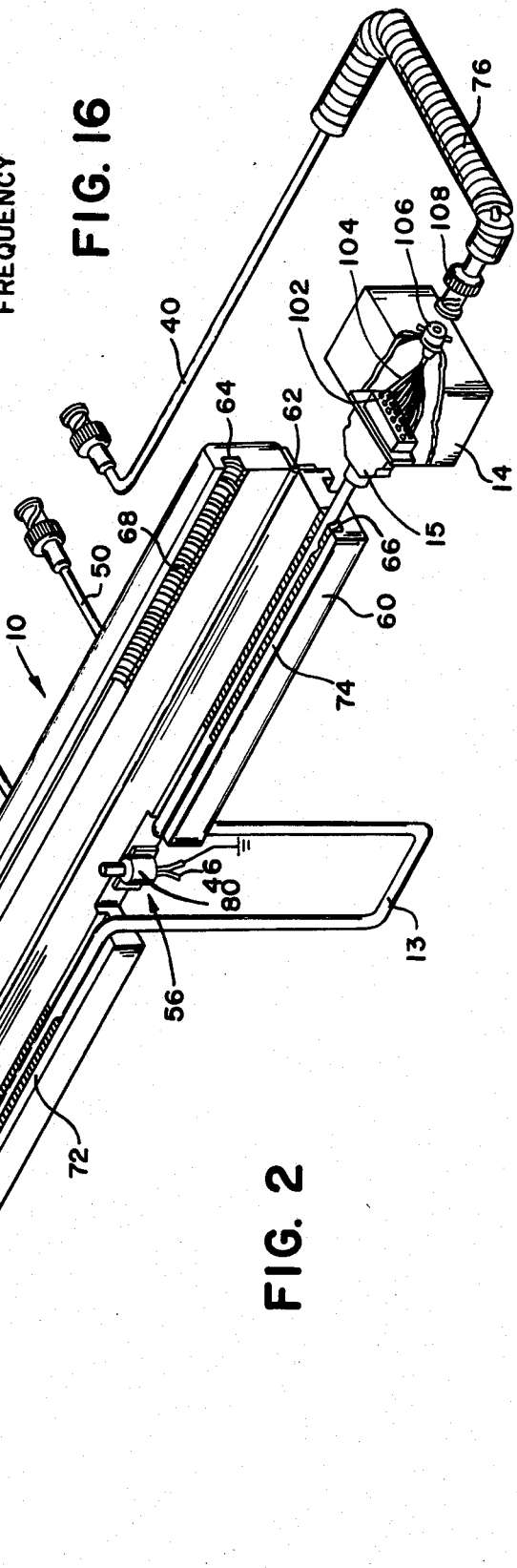
FIG. 2 is a perspective view, partially broken, of the test fixture apparatus and adapter box structure for the testing apparatus illustrated in FIG. 1.

With respect now to FIG. 2 the test fixture 10, the adapter boxes 12 and 14, and the coaxial transmission cables 38 and 40 will be more fully described. The test fixture 10 is actually two identical measurement devices mounted on either side of a common frame. Each measurement device evaluates one end or connector of the cable assembly and the excess of the cable passed between a slot 56 which physically separates the two devices. The test fixture 10 comprises an upper fixture piece 58 and a lower fixture piece 60 which are coupled together along one edge by a hinge 62.

Each of the fixture pieces 58, 60 has a channel 64 and 66, respectively, in which are mounted a plurality of ferrite toroids which have been split or halved. The split toroids mounted in the upper channel 64 are arranged into two groups 68 and 70, while the split toroids in the lower channel 66 are arranged into similar matching groups 72 and 74. When the upper piece 58 of the text fixture 10 is closed the oppositely opposed groupings of half toroids can be clamped around a cable of a cable assembly placed in the channel 66. The toroids when they are clamped together form full toroids which isolate the connectors 11, and 15 from the cable portion 13 of the cable assembly.

Additionally, the invention provides two groups of isolation toroids 76 and 78 mounted around the coaxial input cables 38 and 40 prior to their coupling to the adapter boxes 12 and 14. The isolation of the connectors from either direction is then ensured because any leakage currents moving along the shield of the input cables 38, 40 or along the cable portion 13 of the cable assembly itself will be attenuated by the lossy inductive coupling with the ferrite toroids.

The ferrite toroids on each end of the test fixture are diametrically split and mounted in the hinged frame so that the fixture clamps over the cable assembly under test. This feature permits the measurement to be nondestructive of the cable assembly and further conducive to a rapid insertion and removal of the tested assemblies. When the test fixture 10 closes, it also operates a limit switch 80 to generate a CLAMP signal via signal line 46 to the control unit 20.

As can be better seen in FIGS. 3, 4 and 5, the groups of split toroids are separated into two portions. A first portion, for example, 84 is for isolation of the connector of the cable assembly mounted on that side. A second portion 86 which is shown in an enlarged in FIG. 5 produces a sensing of the leakage signal. The coaxial cable 50 used for sensing the current has its end wrapped around three pick-up toroids forming the portion 86 which is physically separated from the group 84 in the channel 66 by a small space. The end of the cable 50 forms a pick-up structure by shorting the central conductor of the coaxial cable to its shielding at 88. This will produce a signal representative of the RF current flowing along the shield of the cable assembly at that point. The leakage signals detected by the system are the result of many contributing sources such as gaps or poor contact between mating pieces of the shield and signal attenuation through the shielded material. Whatever the source, the result is that standing waves are created on the surface of the shield. The currents developed as a result of the standing waves induce a field around the cable which excites the sensing toroids, for example 86, through inductive coupling.

Two leakage effects, local and global, are measured by the apparatus using the present structure. The local effects are defined as the RF signal picked up concentrically within the sensing toroids. The global effects are the result of any shield leakage occurring in proximity but not within the sensing toroids. Therefore, the leakage signals detected by the present apparatus are a composite of the global and local effects. The local effect is contributed by the small sections of the cable within the sensing toroids and the global effect is contributed by the portion of the cable and connector shield immediately adjacent the sensing toroids. To localize the global effect to the area of interest, i.e., the connector shield-cable shield interface and the connector shield, the isolation toroids 72, 74, 76, and 78 are used to attenuate spurious signals before they reach the sensing toroids.

Each sensing cable, for example the cable referenced 50, is mounted through a bore 90 which communicates to a channel 92 on the bottom of the lower fixture piece 60. Further isolation toroids 94 are provided for the sensing cable 50 before it couples into the coaxial switch 42. Likewise, on the opposite end of the fixture 10, sensing cable 48 has isolation toroids 96 slipped over cable 48. The opposite end of the fixture 10 is also provided with a current sensor 98 of similar construction as that discussed at 86. The sensor 98 is physically separated from isolation toroids 100 of group 72 by a small space.

Returning now for a moment to FIG. 2, the adapter boxes 12 and 14 are constructed to specifically mate with individual styles of multiconductor connectors. Each adapter box, for example 14, may be mounted on the test frame prior to the cable assembly test to match the particular manufacturing run of assemblies. It is evident that a cable assembly may have a different type of connector on either end and, thus, the adapter boxes will have a connector 102 which mates with the particular connector of the cable assembly under test. Within each adapter box all the signal conductors 104 of the connector 102 are bussed together and connected to the center conductor of a coaxial jack 106. The coaxial jack 106 mounts the coaxial coupler 108 of the test cable 40. The adapter box 12 is similarly constructed. This coupling permits the shield of the coaxial cable to be continuous with the adapter box and with the connector shield of the sample cable assembly.

It is crucial to preserve the shield continuity from the adapter box through the connector interface onto the connector shield. In many multiconductor connectors, such as the D subminiature type, insufficient contact surface area creates leakage through gaps, slots or just poor DC contact. The result is a high impedance leaky connection showing up as a substandard shielding even though the cable assembly shielding itself may be performing per specification.

The adapter boxes are constructed of copper or brass with all their outside seams soldered. On the front plate of each adapter box, for example adapter 12, a resilient RF gasket 110 is used to obtain optimum contact surface area, as well as consistent contact resistance with the connector of the cable assembly. Leakage due to the critical interface area at the adapter to connector coupling is thereby minimized. This insures that any signal detected by the current sensors is actually representative of the performance of the connector shield and not merely a poor coupling to the adapter boxes 12, 14.

Generally, a test on a cable assembly is accomplished by placing the cable within the channel 66 of the lower fixture piece 60 and then closing the upper fixture piece 58 over it. A display on the control unit 20 will thereafter indicate what the leakage measured by the sensor toroids is and provide an indication of whether the connector on one end or the other of the assembly is below specification.

Figures 6, 7:
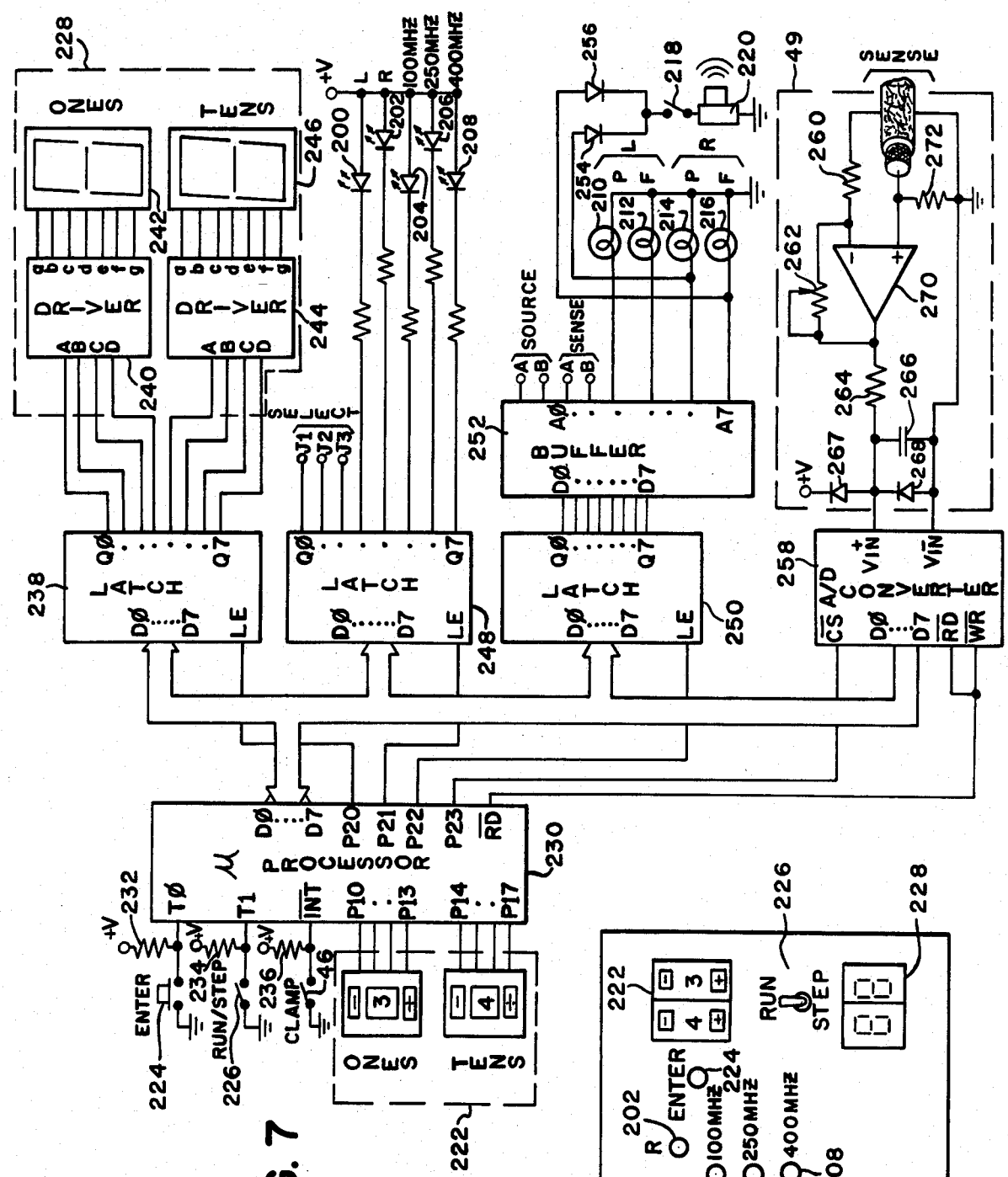
FIG. 6 is a pictorial representation of the front panel of the control unit for the testing apparatus illustrated in FIG. 1.
FIG. 7 is a detailed schematic diagram of the control unit for the testing apparatus illustrated in FIG. 1.

To more fully understand the test method, reference is directed to FIG. 6 where the operator interface to the control unit 20, including several displays and input controls, is illustrated. The front panel of the control unit 20 includes five LEDs 200-208 which are used for indicating test points and test frequencies. For example, if LED 200 is lit, then the left side connector is being tested with the frequency indicated on LEDs 204, 206 and 208. Similarly, if the LED 202 is lit, then the right side connector is being tested at the frequency displayed by the LEDs 204, 206 and 208. The designation left and right side is relative and in this application will be used to indicate the side of the test fixture 10 that the operator faces as he operates the apparatus. Thus, the figures illustrate the apparatus in the same sense as the sides are designated.

Further, the front panel of the control unit has test lamps 210, 212, 214 and 216 which indicate the result of a cable assembly test. Lamps 210 and 214 are lit with a green light to indicate the passage of a test by the left side connector and the right side connector, respectively. Lamps 212 and 216 are lit with a red light to indicate a failure of the test by the left side connector and right side connector, respectively. Additionally, if a switch 218 is in the on position, then a horn 220 will be sounded if either the left connector or right connector has failed a test. The failure of a test at any one of the frequencies causes a failure light. For a pass light to be lit, all of the test frequencies must be attenuated sufficiently.

A pair of digital thumb-wheel switches 222 are used to input a ones digit and a tens digit for indicating a reference level for each of the tests. Test reference levels for each of the frequencies 100 MHz, 250 MHz and 400 MHz for both the left and the right side connectors are entered on these switches. An enter button 224 is used to enter the reference levels when the LEDs 200-208 are lit indicating a particular test point. Further, the front panel of the control unit 20 includes a run/step switch 226 which may be positioned to automatically run all six tests sequentially with just the combination of the results of all tests being shown in the pass/fail lights or in a step mode where each test is run separately and the results displayed individually on the lamps and as power levels on the display 228. The program is stepped through sequentially by hitting the enter button 224 when the apparatus is in the step mode. Additionally, the two digits of the 7 segment LED display 228 are used to output the power levels of the reference input levels and the power levels of the sensed leakage current in db.

An electrical schematic of the control unit 20 will now be more fully described with respect to FIG. 7. The control unit 20 is based on a microprocessor 230 which has a stored program executing within. The microprocessor 230 inputs all the needed data and outputs all needed control signals to accomplish the functions set forth herein. In connection with these operations, the microprocessor 230 receives inputs from the operator controls to develop the commands and modes for operating the apparatus. The T0 input is normally tied to a positive voltage +V through a pull-up resistor 232. The enter signal is generated at the T0 input by grounding the end of the resistor 232 with an enter switch 224. Similarly, the software accessible pin T1 is generally at a high logic level because it is tied to a source of positive voltage +V through pull-up resistor 234. The run/step signal is generated by grounding input T1 with a switch 226. A closed switch 226 is indicative of a step mode and an open switch 226 is indicative of an automatic mode. Likewise, the interrupt terminal INT is generally at a high level by being pulled up by resistor 236 connected to a source of positive voltage +V. An interrupt signal can be generated to the terminal INT by grounding the end of the resistor 236 through the clamp switch 46. The closure of the clamp switch 46 indicates that the upper fixture piece 58 has been closed onto the lower fixture piece 60.

Further input to the microprocessor 230 is provided by the digital switches 222. The ones digit of the switches may be set by the operator and thereafter input to the microprocessor 230 by reading the port 1 pins P10–P13 with the software. In a similar manner, the tens digit can be set by the operator and thereafter input to the microprocessor 230 by reading the port 1 pins P14–P17.

From these inputs, the microprocessor 230 executes its stored program and provides control signals through outputs on its data bus D0–D7, port pins P20–P23, and the read control line RD. Control of the display 228 is provided by a latch 238 which has its latch enable input LE connected to pin P20 of the microprocessor 230. The data inputs of the latch 238 are connected to the data bus D0–D7. Outputs of the latch 238 are used in four bit groups to drive the 7-segment displays 242 and 246 through driver chips 240 and 244, respectively. The Q0–Q3 outputs of latch 238 are decoded as the A-D inputs of the driver 240 to produce signals on the a–g outputs forming the numbers in the display 242. Likewise, the Q4–Q7 outputs of the latch 238 drive the tens digit 246 of the display 228. The microprocessor 230, therefore, displays a number in the 7 segment displays 242 and 246 by outputting a data byte on the data bus and enabling the latch 238 to input that data byte with the pin P20 control line.

The select inputs J1, J2 and J3 of the coaxial switch 34 and the LEDs 200–208 are controlled in a similar manner. The select inputs J1, J2 and J3 are output from the outputs Q0–Q2 of a latch 248 and the LEDs 200–208 are lighted in response to low logic levels on the outputs Q3–Q7 of the latch. The output levels Q0–Q7 of latch 248 are set by storing a data byte from the data bus D0–D7 of the microprocessor 230 in response to a latch enable signal from the port 2 pin P21. The microprocessor 230 thereby selects the particular frequency desired and indicates the test points by outputting different data bytes to the latch 248.

The selected direction switches 34 and 42, the pass/fail lamps 210–216, and the buzzer 220 are controlled in a similar manner. A latch 250 receives data bytes from the data bus of the microprocessor 230 and latches them onto its outputs Q0–Q7 in response to a latch enable signal from port 2 pin P22. This latched output data is buffered by a line driver 252 before being output at a higher voltage level to become the A, B source and sense selection signals, respectively, on outputs A0–A3. The pass/fail lamps 210–216 are commonly connected to ground at one terminal and at the other terminal to the outputs A4–A7 of the line driver 252. Thus, the line driver 252 is driven by the latch 250 to select the direction of the test and to indicate whether a certain connector on one side has passed or failed a test reference level. Further, the horn 220 is connected to the outputs A5–A7 of the line driver 252. These levels are combined in diodes 254 and 256 forming an OR gate for buzzer 220. The buzzer can be disconnected from the system by opening the switch 218.

The microprocessor 230 further controls an A/D converter 258 to provide a data byte on the data bus D0–D7 indicative of the power level of the sensed leakage signal. The A/D converter 258 is enabled for conversion by outputting a low logic level on port 2, pin P23, which is communicated to the chip select *CS input of the converter. Thereafter, a conversion may be initiated by lowering the read output RD of the microprocessor 230 which enables the WR input of the converter 250. The signal input to the converter Vin (+) is the buffered and scaled output of the logarithmic amplifier 44. Resistor 272 forms a termination impedance for the logarithmic amplifier. This analog signal, which is representative of the leakage power, is converted to a digital number by the A/D converter 258 and can be input to the microprocessor 230 by strobing the read input RD of the converter. When the read input RD is strobed, the A/D converter 258 will output a data byte onto the data bus for receipt by the microprocessor 230.

The amplifier 49 is comprised of an operational amplifier 270 which is configured as a noninverting scaling amplifier having gain resistors 262 and 260 connected between ground in the output of the amplifier. The junction of the resistors 260 and 262 is connected to the inverting input of the operational amplifier 270. The gain characteristic of the amplifier 49 is such that the detected power level from logarithmic amplifier 44 is scaled for correct A/D conversion. A low pass filter comprising a resistor 264 and a capacitor 266 is inserted between the amplifier output and A/D input to attenuate any noise on the DC power level to be converted. Diodes 267, 268 clamp the input voltage of the A/D converter to a safe level 0 V–5 V. Preferably, the gain of the amplifier 49 is adjusted by resistor 262 so that a one milliwatt signal will correspond to a 0dbmw output from the sense circuit. In this manner, the smallest measured signal will be $-72$ dbmw in steps of $-\frac{1}{2}$ dbmw when the digital signal from converter 258 is zero.

FIGS. 7 and 8 will now be referenced to more fully describe the operation of the microprocessor 230 during a test. FIG. 8 is a detailed flow chart of the program stored within the microprocessor 230 and controls the peripheral devices for input and output of the parameters and control signals needed to operate the system. The program begins in block A10 where the microprocessor 230 resets the input and output ports. Port 1 and port 2 are the ports used on the microprocessor 230 and are initialized by this block. Next, the microprocessor 230 in block A12 turns on the 7-segment display 228, turns on the LEDs 200–208 in block A14, and turns on the lamps 210–216 in block A16. These operations are performed by outputting the requisite data bytes to the latches 238, 248 and 250, respectively. The lamps, displays and LEDs are turned on as a test to insure that all are operable at the beginning of a test sequence.

After all the displays have been lighted, the program waits at block A18 until the operator presses the enter button. This is an indication to the program to continue and in blocks A20, A22 and A24 the 7-segment display, the LEDs and the lamps are turned off, respectively. Thereafter, the program delays one second in block A26 to provide a separation of the program parts and to allow the operator response time. Next, in block A28, the address of the first test point, the left side connector at the frequency of 100 MHz is stored in the accumulator. Thereafter, the subroutine DBM is called in block A30. The subroutine DBM, as will be more fully explained hereinafter, lights the particular test point whose address is in the accumulator and, thus, requests the operator to input a reference level through the digital switches 228 against which the leakage signal can be tested.

Once the operator has set the digital switches 228 to the desired reference level, he will press the enter button 224 and the subroutine DBM will store the switch settings into memory. The subroutine DBM returns to the main program after it stores the reference level into register R2. The next sequence of program steps, from blocks A32–A50, are the entry of the next five reference levels. The address of the left side connector and the 250 MHz LED is stored in the accumulator in block A32 and the subroutine DBM again called in block A34. The entered reference level for this access is stored in register R3. Similarly, the reference level for the left side connector at 400 MHz is stored in register R4 by blocks A36 and A38. The reference level for the right side connector at 100 MHz is stored in register R5 by blocks A40 and A42. The reference level for the right side connector at 250 MHz is stored in register R6 by blocks A44 and A46. The reference level for the right side connector at 400 MHz is stored in register R7 by blocks A48 and A50. It is noted that this operation provides a reference level for each connector at each frequency used.

After entry of the reference levels, the programs begins a main testing loop. The main testing loop begins at block A52 where the microprocessor 232 will test for an interrupt. If an interrupt is found, it continues to block A56, while if an interrupt is not present, then control is transferred to block A54. In block A54, the microprocessor 230 will blink the db display 228. The interrupt is provided to the microprocessor by the CLAMP signal which indicates that the upper fixture piece is closed on the cable and the test should begin. This is the automatic test initiation signal and must be present before the operation of the apparatus can proceed. Therefore, if the operator has forgotten to close the test fixture, the db display 228 blinks as a reminder.

When the fixture is closed, the next block A56 clears the step flag and then in block A58 tests to determine whether the step switch 226 is closed. If the step switch is not closed, then the apparatus is in automatic mode and the program continues immediately to block A62. However, if the step switch is closed, then block A60 is executed before control is transferred to block A62 and the step flag is set to indicate that this is a manual test.

Next, in block A62, the operational testing of the cable assembly is accomplished by the subroutine TEST. This subroutine steps through six tests where three are provided at the different frequencies of 100 MHz, 250 MHz, and 400 MHz for each connector side. The test routine also will provide operation of the pass/fail lights and the horn 220.

Upon return from the test routine, the program enters an infinite loop in block A64 while testing for an interrupt. If the interrupt is present, it will continually loop through the decision block A64, until it finds the interrupt is terminated. This is an indication to terminate a test and the operator must open the test fixture 10 and the limit switch 46. Once the switch 46 is open, the interrupt is removed from the microprocessor 230 and the program will sequence to block A66. In that step, the program turns off the pass/fail lights and proceeds to the beginning of the test procedure.

Thus, in an automatic mode, many cable assemblies can be rapidly tested by mounting the cable assembly in the test fixture and merely closing the upper fixture piece. Faulty cable assemblies may be discarded upon an audible indication of failure from the horn or a visual indication from the pass/fail lights. The operator merely has to open the test fixture and discard the failed cable assembly and reinsert the next cable assembly for another test. This provides an advantageous automatic mode of operation which generates a great facility and throughput for a production run of cable assemblies.

The subroutine DBM which allows entry of the reference levels will now be more fully explained, if attention will be directed to FIG. 10. The subroutine begins in block A68 where the test point LED whose address is in the accumulator is lighted to indicate which test point for which the reference level should be input. FIG. 9 illustrates a table of the port 21 commands in hexadecimal and binary illustrating those commands which light the test point LEDs. The hex commands D0, B0, 70, C8, A8, and 68 are used to select the test points one-by-one as the DBM subroutine is called in the main loop. After the particular test point is lit, the program enters a waiting loop in block A70 until the operator hits the enter button. This allows him to recognize the lighted LED and go to a chart or other reference documents where he has a reference level written down. He will then input this reference level to the digital switches and thereafter press the enter button to sequence the program to block A72.

The input switches are read through the port 1 pins P10–P17 in block A72 and the lower four bits are masked off by anding the accumulator with hexadecimal F0 in block A74. In block A76 the upper and lower nibbles are swapped in the accumulator and the result is multiplied by ten in block A78. This converts the tens digit of the switch input to binary and the result is saved in an intermediate storage location. Next, the ones switch byte is input in block A80 and the higher four bits masked off of the byte by logically anding the accumulator with hexadecimal OF. The ones digit and tens digit are then combined in block A84 to provide a binary representation of the reference level which can be used in further calculations in the microprocessor.

Next, the reference level is checked to determine whether it is less than $-7$ dbmw in block A86. If it is, and the operator has input an invalid reference level, and in block A88 the variable db is set equal to 72. Next, the reference level is subtracted from 72 in block A90 to give an indication of the relative reference measured by the apparatus. In block A92 the value is then multiplied by two and stored in register R0 in block A94. The value is then displayed in block A96 which provides an echo of the input to insure that the operator has entered the right reference level. The system displays the reference level for one second by delaying that amount of time in block A98. Thereafter, in block A100 the display is blanked and the reference level loaded back into the accumulator in block A102 before the program exits back to the main routine for the next reference level entry.

The subroutine BLINK is shown in FIG. 11 and is an input/output routine used to turn off and turn on the display alternately between delays of 250 milliseconds. Blocks A104 and A108 turn the display on and turn the display off, respectively, and blocks A106 and A110 delay program execution 250 milliseconds.

The subroutine TEST will now be more fully explained, if reference will be directed to FIG. 12. In block A150, the program delays one second after its entry and then clears register R0 in block A152. Register R0 will be used as a intermediate storage location for an indicator of the pass/fail test and, thus, is initialized in this step. Next, in block A154 the left source output from coaxial switch 34 is commanded. The left input to the coaxial switch 42 for the sense circuit 16 is selected in block A156 thereafter. These selections are made by outputting the correct data byte to the latch 250 which provides output signals A on the source and sense control lines. In block A158, the flag F1 is cleared to indicate that this part of the control routine is testing the left side connector.

The next sequence of operations in blocks A160-A200 are the actual tests for the leakage signals for each connector at the three different frequencies and compared against the stored reference levels. Block A160 produces the hexadecimal output D1 to port 21 which loads the latch 248 With that value. From the table in FIG. 9, it is seen that a hexadecimal value of D1 will select the J1 output and light the diode for the left connector side and the 100 MHz test frequency. The J1 selection signal causes the coaxial switch 28 to select the RF oscillator 22 which injects the 100 MHz signal into the connector on the left side of the test fixture. Next, in block A162, the reference level that has previously been stored by the DBM subroutine in register R2 is loaded into the accumulator. Thereafter, the subroutine LEVEL is called in block A164 to compare that reference level to the input from the logarithmic amplifier. As indicated previously, the pass/fail indication for this test is stored in register R0 for output at a later time if the apparatus is in an automatic mode or will be display immediately, if the apparatus is in a manual or step mode.

Thereafter, in blocks A166, A168 and Block A170, the 250 MHz test is performed for the left connector side. Block A166 outputs the hexadecimal value B2 to port 21 thereby selecting with the J2 signal the oscillator 24 and lighting the left side connector LED 200 and the 250 MHz LED 206. The reference level for this test, stored in R3, is placed in the accumulator in block A168 before the subroutine LEVEL is called in block A170. Blocks A172–A176 perform the 400 MHz test for the left side connector in a similar manner.

This completes the three tests for the left connector side and leaves the three tests for the right connector side yet to be performed. Therefore, in block A178 and A180 the right source output and right sense input for the coaxial switches 34 and 42 are selected. The selection takes place in the same manner as the left source and sense selection did by setting the signals A on the output of the latch 238.

Thereafter, the flag F1 is set in block A182 to provide an indication to the microprocessor 230 that the right side connector is being tested. In blocks A184-A188 the 100 MHz test for the right side connector is accomplished in the same manner as the three previous tests for the left side connector. The hexadecimal output command C9 from block A184 selects the J1 output on the coaxial cable switch 28 and lights the right side connector LED 202 and 100 MHz LED 204. The reference level for the right side connector at 100 MHz is loaded into the accumulator from its intermediate storage in register R5 in block A186 and the subroutine LEVEL is called in block A188. Blocks A190–A194 and blocks A196–A200 perform a similar task for the right side connector for the frequencies of 250 MHz and 400 MHz, respectively.

After all the tests have been accomplished the LEDs 200-208 at port 21 are blanked in block A202. Thereafter, in block A204, the register R0 which contains the accumulation of whether either the left or right side connector failed any of the frequency tests used to turn on the pass/fail lamps 210-212. At this time, if switch 218 is closed, the horn will also sound if either lamp 212 or lamp 216 is lit thereby providing an audible backup for the visual indication of a failure of either one or both connectors of the cable assembly. The program then continues in block A206 by shutting the display off and then testing the step flag to determine whether the apparatus is operating in a manual or automatic mode. If the apparatus is in an automatic mode, then the TEST subroutine is done and the program exits. On the other hand, if the step mode flag is present, then control is transferred to block A210 where the program loops waiting for the enter button to be pressed. After the enter button has been pressed, the program will turn off the pass/fail lights in block 212 before exiting.

FIG. 13 will now be more fully described to illustrate the operation of the subroutine LEVEL. The program is used for comparing input leakage signal for a particular test to one of the stored reference levels. In block A112 the program begins by storing the pass/fail level that was transferred in the accumulator when the subroutine was called. The program then delays 100 milliseconds in block A114 before starting the A/D convertor in block A116. The A/D convertor is allowed to settle by delaying one millisecond in block A110. Thereafter, the result from the A/D conversion is input over the data bus in block A120. As mentioned before, the starting of the A/D conversion and the input of the converted byte is provided by producing a low level chip select signal CS on pin P23 of the microprocessor and strobing the RD output of the microprocessor 230. The result of the A/D conversion then has the reference level subtracted from it in block A122. The sign of the result is tested in block A124 to determine whether the particular connector has passed at the tested frequency. If the leakage signal level is greater than the reference level, then a path indicating a failure is taken to block A134. However, if the test is passed, then the sequence is to block A126.

The accumulator has stored in it the A/D result before calling the subroutine DISPLAY to output that value to the 7 segment display 228. Next, the step flag is tested in block A130 to determine whether it is a manual or automatic mode. If the step flag is present, the system waits in block A132 until the operator presses the enter button and then exits.

On a failure, in block A134, the left/right side flag F1 is tested to determine which connector has failed the test. If F1 is present, then the right side connector has failed and in block A136 an indicator of that failure is stored in register R0. If, however, the flag F1 is not present, then in block A138 an indication that the left side connector has failed is inserted into register R0. These failure indications are combined in block A140 with previous failure indications to store an overall status word in register RO. The status word is shown in pictorial form in FIG. 14. Thereafter, the program sequences to the completion blocks of the routine A126-A130 where the failure value is displayed in the 7 segment display before exiting for the next test routine.

The subroutine DISPLAY will now be more fully explained with reference to the detailed flow chart in FIG. 15. Initially, the A/D value is divided by two in block A214 because of the multiplication of that in the input routine which doubled the value. Next, this value is subtracted from the 72 db and the result is applied to the accumulator in block A216. This result is complemented in block A218 and its sign tested in block A220. If the result is less than zero, then the accumulator is set to zero in block A22. Otherwise, the program continues immediately to block A224 where the accumulator is again complemented.

The sequence from block A218 to block A224 is a test for a negative result of the subtraction. If the result is negative, then the db level is set equal to zero in block A222. After this test has been made, the input value is converted from the binary number system to a BCD representation in block A226 before being output to the 7 segment display in block A228. The output to the display is accomplished by writing the accumulator to the latch 238. The display routine then returns to the calling routine.

Figure 16:
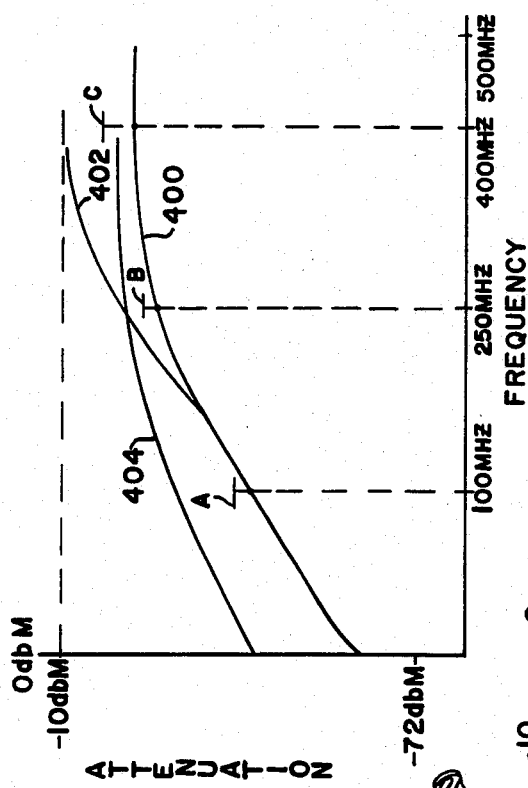
FIG. 16 is a pictorial representation of the characteristic attenuation curves for a cable assembly.

The method of using this apparatus to test a cable assembly will now be more fully described with respect to FIG. 16. In that figure there is shown a number of reference levels A, B, and C. These reference levels indicate in −dbM the amount of attenuation which should be produced by the connector shielding if it is to meet specification. The reference levels define a test curve 400 which is a sweep of all frequencies from 100 MHz to 500 MHz. The test frequencies at which the reference levels are chosen are situated such that common failure modes of the type of cable assemblies tested will be sure to exceed at least one reference level.

For example, curve 402 is characteristic of a cable assembly with a broken interface between the cable shield and the connector shield while curve 404 is characteristic of a poorly constructed connector shield, perhaps with the shield tape unwrapped. Thus, it is seen that if reference levels A, B, C are chosen at 100 MHz, 250 MHz, and 400 MHz that characteristics 402 and 404 will fail at least one reference level. Thus, because of the relatively well behaved characteristics of the cable assemblies in their failure modes, the entire test frequency range does not have to be scanned but merely simulated by a small preselected number of frequencies thereby saving considerable cost over a system which sweeps all the frequencies of a range.

The reference levels, after the frequencies have been chosen, are selected by first testing the leakage signals from an unshielded cable assembly in the test apparatus. The result is then added to the levels of attenuation required by the specification for the assembly tested. The test apparatus advantageously measures the unshielded levels in the manual mode of operation as previously described by mounting the unshielded cable in the test fixture 10 and stepping through the test frequencies by hitting the enter button 224. The power levels developed from the unshielded cable are read from the dbM level display 228 and recorded. The nominal power level output from the three RF oscillators 22, 24 and 26 is −10 dbmw and is approximately the level which will be recorded for an unshielded cable assembly.

The attenuation specification for a typical cable assembly of the type under test is then examined to determine the attenuation needed at each test frequency. These amounts are added to the measured levels for the unshielded cable assembly to yield the reference levels. Once the reference levels have been developed, the operator causes the apparatus to revert back to automatic mode where the reference levels are input and the automated test performed for a large manufacturing run of cables.

While a preferred embodiment of the invention has been illustrated, it will be obvious to those skilled in the art that various modifications and changes may be made thereto without departing from the spirit and scope of the invention as defined in the appended claims.

```
 2  ;****************************************************************
 3  ;*                                                              *
 4  ;*             PRODUCTION SCAT SCAN TESTER                      *
 5  ;*                                                              *
 6  ;*   The program is written for an 8748 microprocessor. It      *
 7  ;*   controls the scat scan tester.  It's main function is      *
 8  ;*   to measure the amount of RF leakage from the shielded      *
 9  ;*   cable assembly under test. Both ends of the cable are      *
10  ;*   tested at 100, 250, & 400 MHz. The measured level is       *
11  ;*   compared to stored maximum levels. A pass/fail judge-      *
12  ;*   ment is made based upon the result.                        *
13  ;*                                                              *
14  ;*   Measurement range:   0 dB to -72 dB.                       *
15  ;*                                                              *
16  ;*                                                              *
17  ;*                                 Written by Leonard Visser    *
18  ;****************************************************************
19
20
```

```
              21          ;                    MACRO DEFINITIONS
              22
              23 OUT20    MACRO    X           ;;OUTPUT BYTE TO PORT 20
              24          MOV      A,X
              25          OUTL     BUS,A
              26          ORL      P2,#1
              27          ANL      P2,#0FEH
              28          ENDM
              29
              30 OUT21    MACRO    X           ;;OUTPUT BYTE TO PORT 21
              31          MOV      A,X
              32          OUTL     BUS,A
              33          ORL      P2,#2
              34          ANL      P2,#0FDH
              35          ENDM
              36
              37 OUT22    MACRO    X           ;;OUTPUT BYTE TO PORT 22
              38          MOV      A,X
              39          OUTL     BUS,A
              40          ORL      P2,#4
              41          ANL      P2,#0FBH
              42          ENDM
              43
              44 IN23     MACRO                ;;INPUT BYTE FROM PORT 23
              45          ANL      P2,#0F7H
              46          MOVX     A,@R0
              47          ORL      P2,#8
              48          ENDM
              49
              50 ;-----------------------------------------------------
              51 $EJECT
              52
              53          ;Upon power-up, the program starts executing here.
              54
0000 23F8     55 RESET:   MOV      A,#0F8H    ;DE-SELECT ALL EXTERNAL PORTS
0002 3A       56          OUTL     P2,A
              57
              58 ;-----------------------------------------------------
              59          ;                    LAMP TEST
              60
              61 LAMPCK:  OUT20    #88H        ;TURN ON ALL SEGS OF 7 SEG DISPLAY
0003 2388     62+         MOV      A,#88H
0005 02       63+         OUTL     BUS,A
0006 8A01     64+         ORL      P2,#1
0008 9AFE     65+         ANL      P2,#0FEH
              66          OUT21    #0          ;TURN ON ALL LEDS
000A 2300     67+         MOV      A,#0
000C 02       68+         OUTL     BUS,A
000D 8A02     69+         ORL      P2,#2
000F 9AFD     70+         ANL      P2,#0FDH
              71          OUT22    #0F0H       ;TURN ON ALL LAMPS
0011 23F0     72+         MOV      A,#0F0H
0013 02       73+         OUTL     BUS,A
0014 8A04     74+         ORL      P2,#4
0016 9AFB     75+         ANL      P2,#0FBH
              76
0018 3444     77          CALL     ENTER       ;WAIT TILL 'ENTER' IS PRESSED
              78
              79          OUT20    #0FFH       ;TURN OFF 7 SEG DISPLAY
001A 23FF     80+         MOV      A,#0FFH
```

```
001C 02          81+         OUTL    BUS,A
001D 8A01        82+         ORL     P2,#1
001F 9AFE        83+         ANL     P2,#0FEH
                 84          OUT21   #0F8H   ;TURN OFF ALL LEDS
0021 23F8        85+         MOV     A,#0F8H
0023 02          86+         OUTL    BUS,A
0024 8A02        87+         ORL     P2,#2
0026 9AFD        88+         ANL     P2,#0FDH
                 89          OUT22   #0      ;TURN OFF LAMPS
0028 2300        90+         MOV     A,#0
002A 02          91+         OUTL    BUS,A
002B 8A04        92+         ORL     P2,#4
002D 9AFB        93+         ANL     P2,#0FBH
                 94
002F 23FA        95          MOV     A,#250  ;WAIT 1 SEC.
0031 343B        96          CALL    DELAY
0033 343B        97          CALL    DELAY
0035 343B        98          CALL    DELAY
0037 343B        99          CALL    DELAY
                 100
                 101 $EJECT
                 102 ;----------------------------------------
                 103     ;          ENTER 6 PASS/FAIL LEVELS
                 104
0039 23D0        105 LEVELS: MOV    A,#0D0H ;ENTER VALUE FOR L, 100 MHZ
003B 3455        106         CALL   DBM     ;RETURNS VALUE IN ACC.
003D AA          107         MOV    R2,A    ;STORE IN R2
                 108
003E 23B0        109         MOV    A,#0B0H ;ENTER VALUE FOR L, 250 MHZ
0040 3455        110         CALL   DBM
0042 AB          111         MOV    R3,A
                 112
0043 2370        113         MOV    A,#70H  ;ENTER VALUE FOR L, 400 MHZ
0045 3455        114         CALL   DBM
0047 AC          115         MOV    R4,A
                 116
0048 23C8        117         MOV    A,#0C8H ;ENTER VALUE FOR R, 100 MHZ
004A 3455        118         CALL   DBM
004C AD          119         MOV    R5,A
                 120
004D 23A8        121         MOV    A,#0A8H ;ENTER VALUE FOR R, 250 MHZ
004F 3455        122         CALL   DBM
0051 AE          123         MOV    R6,A
                 124
0052 2368        125         MOV    A,#68H  ;ENTER VALUE FOR R, 400 MHZ
0054 3455        126         CALL   DBM
0056 AF          127         MOV    R7,A
                 128
                 129         OUT21  #0F8H   ;BLANK THE LEDs.
0057 23F8        130+        MOV    A,#0F8H
0059 02          131+        OUTL   BUS,A
005A 8A02        132+        ORL    P2,#2
005C 9AFD        133+        ANL    P2,#0FDH
                 134
                 135 ;----------------------------------------
                 136     ;          IS CLAMP CLOSED?
                 137
005E 8662        138 CLAMP1: JNI    RUNTST  ;JUMP TO RUNTST IF YES
0060 046A        139         JMP    BLINK   ;JUMP TO BLINK IF NO
                 140
```

```
                         141 ;------------------------------------------------
                         142      ;           IS RUN/STEP = RUN?
                         143
0062 85                  144 RUNTST: CLR   F0       ;F0 = 1 MEANS RUN
0063 5666                145         JT1   TC       ;JUMP IF YES
0065 95                  146         CPL   F0       ;F0 = 0 MEANS STEP
                         147
                         148 ;------------------------------------------------
                         149      ;              TEST CABLE
                         150
0066 148B                151 TC:    CALL  TEST     ;ELSE TEST CABLE
0068 0480                152        JMP   CLAMP2
                         153
                         154 ;------------------------------------------------
                         155      ;          BLINK dB LEVEL DISPLAY
                         156
                         157 BLINK: OUT20 #0CCH    ;DISPLAY ON
006A 23CC                158+       MOV   A,#0CCH
006C 02                  159+       OUTL  BUS,A
006D 8A01                160+       ORL   P2,#1
006F 9AFE                161+       ANL   P2,#0FEH
0071 23FA                162        MOV   A,#250   ;WAIT 250 MS.
0073 343B                163        CALL  DELAY
                         164        OUT20 #0FFH    ;DISPLAY OFF
0075 23FF                165+       MOV   A,#0FFH
0077 02                  166+       OUTL  BUS,A
0078 8A01                167+       ORL   P2,#1
007A 9AFE                168+       ANL   P2,#0FEH
007C 343B                169        CALL  DELAY    ;WAIT 255 MS.
007E 045E                170        JMP   CLAMP1
                         171
                         172 ;------------------------------------------------
                         173      ;           IS CLAMP CLOSED?
                         174
0080 8680                175 CLAMP2: JNI   CLAMP2  ;LOOP TILL CLAMP IS OPENED
                         176
                         177 ;------------------------------------------------
                         178      ;       TURN OFF PASS/FAIL LIGHTS
                         179
                         180 TURNOF: OUT22 #0
0082 2300                181+       MOV   A,#0
0084 02                  182+       OUTL  BUS,A
0085 8A04                183+       ORL   P2,#4
0087 9AFB                184+       ANL   P2,#0FBH
0089 045E                185        JMP   CLAMP1
                         186 $EJECT
                         187 ;************************************************
                         188 ;              TEST SUBROUTINE
                         189 ;
                         190 ; This subroutine tests the cable comparing the measured
                         191 ; RF leakage levels to those entered as maximums. If they
                         192 ; are below the maximum, the pass light is lit, else the
                         193 ; fail light is lit. The test is stepped through using
                         194 ; the 'ENTER' button if F0 flag = 1.
                         195 ;
                         196 ;************************************************
                         197
008B 23FA                198 TEST:  MOV   A,#250   ;WAIT 1 SEC.
008D 343B                199        CALL  DELAY
008F 343B                200        CALL  DELAY
```

```
0091 343B      201        CALL    DELAY
0093 343B      202        CALL    DELAY
               203
0095 B800      204        MOV     R0,#0       ;TEMP STORAGE FOR PASS/FAIL RESULTS
               205        OUT22   #5          ;SELECT LEFT END
0097 2305      206+       MOV     A,#5
0099 02        207+       OUTL    BUS,A
009A 8A04      208+       ORL     P2,#4
009C 9AFB      209+       ANL     P2,#0FBH
009E A5        210        CLR     F1          ;END FLAG = LEFT
               211        OUT21   #0D1H       ;SELECT 100 MHZ
009F 23D1      212+       MOV     A,#0D1H
00A1 02        213+       OUTL    BUS,A
00A2 8A02      214+       ORL     P2,#2
00A4 9AFD      215+       ANL     P2,#0FDH
00A6 FA        216        MOV     A,R2        ;GET PASS/FAIL LEVEL
00A7 340C      217        CALL    LEVEL       ;MEASURE LEVEL AND PASS/FAIL CABLE
               218
               219        OUT21   #0B2H       ;SELECT 250 MHZ
00A9 23B2      220+       MOV     A,#0B2H
00AB 02        221+       OUTL    BUS,A
00AC 8A02      222+       ORL     P2,#2
00AE 9AFD      223+       ANL     P2,#0FDH
00B0 FB        224        MOV     A,R3
00B1 340C      225        CALL    LEVEL       ;MEASURE LEVEL AND PASS/FAIL CABLE
               226
               227        OUT21   #74H        ;SELECT 400 MHZ
00B3 2374      228+       MOV     A,#74H
00B5 02        229+       OUTL    BUS,A
00B6 8A02      230+       ORL     P2,#2
00B8 9AFD      231+       ANL     P2,#0FDH
00BA FC        232        MOV     A,R4
00BB 340C      233        CALL    LEVEL       ;MEASURE
               234
               235        OUT22   #0AH        ;SELECT RIGHT END
00BD 230A      236+       MOV     A,#0AH
00BF 02        237+       OUTL    BUS,A
00C0 8A04      238+       ORL     P2,#4
00C2 9AFB      239+       ANL     P2,#0FBH
00C4 B5        240        CPL     F1          ;END FLAG = RIGHT
               241        OUT21   #0C9H       ;SELECT 100 MHZ
00C5 23C9      242+       MOV     A,#0C9H
00C7 02        243+       OUTL    BUS,A
00C8 8A02      244+       ORL     P2,#2
00CA 9AFD      245+       ANL     P2,#0FDH
00CC FD        246        MOV     A,R5
00CD 340C      247        CALL    LEVEL
               248
               249        OUT21   #0AAH       ;SELECT 250 MHZ
00CF 23AA      250+       MOV     A,#0AAH
00D1 02        251+       OUTL    BUS,A
00D2 8A02      252+       ORL     P2,#2
00D4 9AFD      253+       ANL     P2,#0FDH
00D6 FE        254        MOV     A,R6
00D7 340C      255        CALL    LEVEL
               256
               257        OUT21   #6CH        ;SELECT 400 MHZ
00D9 236C      258+       MOV     A,#6CH
00DB 02        259+       OUTL    BUS,A
00DC 8A02      260+       ORL     P2,#2
```

```
00DE 9AFD      261+         ANL    P2,#0FDH
00E0 FF        262          MOV    A,R7
00E1 340C      263          CALL   LEVEL
               264
               265          OUT21  #0F8H     ;TURN OFF LEDs
00E3 23F8      266+         MOV    A,#0F8H
00E5 02        267+         OUTL   BUS,A
00E6 8A02      268+         ORL    P2,#2
00E8 9AFD      269+         ANL    P2,#0FDH
               270
00EA F8        271          MOV    A,R0      ;TURN ON CORRECT PASS/FAIL LIGHTS
00EB B2EF      272          JB5    T1
00ED 4310      273          ORL    A,#10H
00EF F2F3      274 T1:      JB7    T2
00F1 4340      275          ORL    A,#40H
00F3 02        276 T2:      OUTL   BUS,A
00F4 8A04      277          ORL    P2,#4
00F6 9AFB      278          ANL    P2,#0FBH
               279          OUT20  #0FFH     ;TURN OFF dB DISPLAY
00F8 23FF      280+         MOV    A,#0FFH
00FA 02        281+         OUTL   BUS,A
00FB 8A01      282+         ORL    P2,#1
00FD 9AFE      283+         ANL    P2,#0FEH
               284
00FF B602      285          JF0    TS        ;IF STEP MODE THEN JUMP
0101 83        286          RET              ;ELSE EXIT
               287
0102 3444      288 TS:      CALL   ENTER     ;WAIT FOR ENTER BUTTON
               289          OUT22  #0        ;TURN OFF PASS/FAIL LIGHTS
0104 2300      290+         MOV    A,#0
0106 02        291+         OUTL   BUS,A
0107 8A04      292+         ORL    P2,#4
0109 9AFB      293+         ANL    P2,#0FBH
010B 83        294          RET              ;EXIT
               295
               296 $EJECT
               297 ;************************************************************
               298 ;                      LEVEL SUBROUTINE
               299 ;
               300 ; This subroutine measures the signal level at the A/D
               301 ; converter input and compares it to the pass/fail level.
               302 ; Call with the pass/fail level in the acc., F0 indicating
               303 ; step/run status, and F1 indicating left/right status.
               304 ; R0 will be returned with the corresponding fail bit set
               305 ; if the measured level is greater than the pass/fail level.
               306 ;
               307 ;************************************************************
               308
010C D5        309 LEVEL:   SEL    RB1       ;USE SECONDARY REGISTERS
010D AF        310          MOV    R7,A      ;STORE PASS/FAIL LEVEL
010E 2364      311          MOV    A,#100    ;DELAY 100 MS., SETTLE LEVELS
0110 343B      312          CALL   DELAY
               313          IN23             ;START A/D CONVERSION
0112 9AF7      314+         ANL    P2,#0F7H
0114 80        315+         MOVX   A,@R0
0115 8A08      316+         ORL    P2,#8
0117 2301      317          MOV    A,#1      ;WAIT 1 MS
0119 343B      318          CALL   DELAY
               319          IN23             ;INPUT A/D RESULT
011B 9AF7      320+         ANL    P2,#0F7H
```

```
011D 80        321+           MOVX   A,@R0
011E 8A08      322+           ORL    P2,#8
0120 AE        323            MOV    R6,A           ;STORE VALUE
0121 37        324            CPL    A              ;A = A/D - PASS/FAIL
0122 6F        325            ADD    A,R7
0123 37        326            CPL    A
0124 F631      327            JC     PASS           ;JUMP TO PASS IF NEGATIVE
               328
0126 762C      329 FAIL:      JF1    FR             ;JUMP IF FAIL RIGHT END
0128 2320      330            MOV    A,#20H         ;FAIL LEFT END
012A 242E      331            JMP    L1
               332
012C 2380      333 FR:        MOV    A,#80H         ;FAIL RIGHT END
012E C5        334 L1:        SEL    RB0
012F 48        335            ORL    A,R0
0130 A8        336            MOV    R0,A           ;STORE PASS/FAIL STATUS
               337
0131 D5        338 PASS:      SEL    RB1
0132 FE        339            MOV    A,R6           ;GET A/D VALUE
0133 3490      340            CALL   DSPLAY         ;DISPLAY dB EQUIVALENT
               341
0135 B638      342            JF0    STEPP          ;JUMP IF STEP MODE
0137 93        343            RETR                  ;EXIT IF RUN MODE
               344
0138 3444      345 STEPP:     CALL   ENTER          ;WAIT FOR 'ENTER' BUTTON
013A 93        346            RETR                  ;EXIT
               347
               348 $EJECT
               349 ;****************************************************************
               350 ;                         DELAY SUBROUTINE
               351 ;
               352 ;   This subroutine causes a delay ranging from 1 - 256 ms.
               353 ;   Call with the number of ms. to delay in the acc. None
               354 ;   of the primary registers are altered including the acc.
               355 ;
               356 ;****************************************************************
               357
013B D5        358 DELAY:     SEL    RB1            ;USE SECONDARY REGISTERS
013C AC        359            MOV    R4,A
013D BBC8      360 D1:        MOV    R3,#200
013F EB3F      361 D2:        DJNZ   R3,D2
0141 EC3D      362            DJNZ   R4,D1
0143 93        363            RETR
               364
               365
               366 ;****************************************************************
               367 ;                         ENTER SUBROUTINE
               368 ;
               369 ;   This subroutine is used to detect the pressing of the
               370 ;   'ENTER' button. No parameters are passed, the CPU just
               371 ;   waits till the button is pressed then returns. The acc
               372 ;   is altered.
               373 ;
               374 ;****************************************************************
               375
0144 2644      376 ENTER:     JNT0   ENTER          ;IF PRESSED, WAIT TILL IT'S NOT
0146 230A      377            MOV    A,#10
0148 343B      378            CALL   DELAY
014A 364A      379 E1:        JT0    E1             ;WAIT TILL PRESSED
014C 343B      380            CALL   DELAY
```

```
014E 364A      381           JT0    E1       ;IF NOT STILL PRESSED THEN GOTO E1
               382
0150 2650      383 E2:       JNT0   E2       ;WAIT TILL RELEASED
0152 343B      384           CALL   DELAY
0154 83        385           RET
               386
               387 $EJECT
               388 ;***************************************************************
               389 ;                        DBM SUBROUTINE
               390 ;
               391 ; This subroutine is used to input set points from the 2
               392 ; thumbwheel switches. Call it with the byte to output
               393 ; to the LED port in the acc. The thumbwheels present 2
               394 ; BCD numbers which are converted to the corresponding
               395 ; value which would be read from the A/D converter. This
               396 ; number is returned in the acc.
               397 ;                  A/D value = 2 * (72 - dB).
               398 ;
               399 ;***************************************************************
               400
0155 02        401 DBM:      OUTL   BUS,A    ;INDICATE TEST PT WITH LEDS
0156 8A02      402           ORL    P2,#2
0158 9AFD      403           ANL    P2,#0FDH
               404
015A 3444      405           CALL   ENTER    ;WAIT FOR ENTER BUTTON
               406
015C 09        407           IN     A,P1     ;INPUT SWITCH SETTING (TENS)
015D 37        408           CPL    A
015E 53F0      409           ANL    A,#0F0H
0160 47        410           SWAP   A
0161 B809      411           MOV    R0,#9
0163 A9        412           MOV    R1,A
0164 69        413 MULT:     ADD    A,R1     ;MULTIPLY BY 10
0165 E864      414           DJNZ   R0,MULT
0167 A9        415           MOV    R1,A     ;STORE RESULT IN R1
               416
0168 09        417           IN     A,P1     ;INPUT SWITCH SETTING (ONES)
0169 37        418           CPL    A
016A 530F      419           ANL    A,#0FH
               420
016C 69        421           ADD    A,R1     ;ADD TENS AND ONES VALUES
016D A9        422           MOV    R1,A
016E 03B7      423           ADD    A,#0B7H  ;TEST FOR > 72 LIMIT
0170 E674      424           JNC    SUBT
0172 B948      425           MOV    R1,#72   ;IF > 72 THEN SET = 72
0174 2348      426 SUBT:     MOV    A,#72    ;A = 72 - dB
0176 37        427           CPL    A
0177 69        428           ADD    A,R1
0178 37        429           CPL    A
0179 E7        430           RL     A        ;A = A * 2
017A A8        431           MOV    R0,A     ;STORE FINAL VALUE IN R0
               432
017B 3490      433           CALL   DSPLAY   ;DISPLAY VALUE ON 7 SEGS
               434
017D 23FA      435           MOV    A,#250   ;WAIT 1 SEC
017F 343B      436           CALL   DELAY
0181 343B      437           CALL   DELAY
0183 343B      438           CALL   DELAY
0185 343B      439           CALL   DELAY
               440
```

```
                           441          OUT20    #0FFH      ;BLANK THE DISPLAY
0187 23FF                  442+         MOV      A,#0FFH
0189 02                    443+         OUTL     BUS,A
018A 8A01                  444+         ORL      P2,#1
018C 9AFE                  445+         ANL      P2,#0FEH
018E F8                    446          MOV      A,R0       ;RETURN WITH RESULT IN ACC.
018F 83                    447          RET
                           448
                           449
                           450  ;***********************************************************
                           451  ;                        DSPLAY SUBROUTINE
                           452  ;
                           453  ;  This subroutine takes a A/D reading and displays it on
                           454  ;  the 7-seg display in dBs. Pass the A/D value in the acc.
                           455  ;  No primary registers are altered, the acc returns changed.
                           456  ;
                           457  ;***********************************************************
                           458
0190 97                    459  DSPLAY:  CLR     C          ;A = ADC VALUE/2
0191 67                    460           RRC     A
0192 D5                    461           SEL     RB1        ;USE SECONDARY REGISTERS
0193 A9                    462           MOV     R1,A
0194 2348                  463           MOV     A,#72      ;A = 72 - A
0196 37                    464           CPL     A
0197 69                    465           ADD     A,R1
0198 37                    466           CPL     A
0199 E69C                  467           JNC     BCD        ;TEST FOR > 0 dB
019B 27                    468           CLR     A          ;IF > 0 THEN = 0
                           469
019C B90A                  470  BCD:     MOV     R1,#10     ;CONVERT FROM BINARY TO BCD
019E BA00                  471           MOV     R2,#0      ;TEMP FOR INT(BINARY/10)
01A0 97                    472           CLR     C
01A1 37                    473  DY1:     CPL     A
01A2 69                    474           ADD     A,R1
01A3 37                    475           CPL     A
01A4 F6A9                  476           JC      DY2
01A6 1A                    477           INC     R2
01A7 24A1                  478           JMP     DY1
                           479
01A9 030A                  480  DY2:     ADD     A,#10      ;A = 1's DIGIT
01AB 2A                    481           XCH     A,R2
01AC 47                    482           SWAP    A
01AD 6A                    483           ADD     A,R2       ;A = 10's + 1's BCD DIGITS
                           484
01AE 02                    485           OUTL    BUS,A      ;WRITE RESULT TO DISPLAY
01AF 8A01                  486           ORL     P2,#1
01B1 9AFE                  487           ANL     P2,#0FEH
                           488
01B3 93                    489           RETR               ;EXIT
                           490
                           491
                           492  ;***********************************************************
                           493
```

What is claimed is:

1. An apparatus for testing a cable end of a shielded cable assembly having a cable with at least one cable end electrically terminated by a connector, said apparatus comprising:

means for injecting said connector of said cable assembly with at least one test signal;

means for electrically isolating the injecting means from said connector;

means for electrically isolating the cable of the assembly from said connector;

means, located between said isolation means, for sensing a leakage signal radiated from the surface of the cable end and from said connector where the amplitude of the leakage signal is indicative of the quality of the shielding of the connector; and means for comparing said leakage signal with a threshold and for generating a comparison signal indicating whether the leakage signal is in excess of said threshold.

2. An apparatus for testing as set forth in claim 1 wherein said cable assembly comprises the cable with two cable ends terminated by said connector at said at least one cable end and terminated by a second connector at the other cable end, said apparatus further comprising:

second means for injecting said second connector of said cable assembly with said at least one test signal;

second means for electrically isolating the second injecting means from said second connector;

second means for electrically isolating the other cable end of the cable assembly from said second connector;

second means, located between said second isolation means, for sensing a second leakage signal radiated from the surface of the other cable end and from said second connector where the amplitude of the second leakage signal is indicative of the quality of the shielding of the second connector; and said comparing means further comparing said second leakage signal with a second threshold and generating a second comparison signal indicating whether the second leakage signal is in excess of said second threshold.

3. An apparatus for testing as set forth in claim 2 further including:

means for switching said at least one test signal between said injecting means and said second injecting means.

4. An apparatus for testing as set forth in claim 2 further including:

means for switching said comparing means between said leakage signal and said second leakage signal.

5. An apparatus for testing as defined in claim 3 wherein:

said means for injecting said at least one test signal is adapted to operate at more than one test frequency.

6. An apparatus for testing as defined in claim 5 wherein:

said means for injecting said at least one test signal is adapted to operate at said more than one test frequency and at more than one amplitude.

7. An apparatus for testing as defined in claim 1 wherein:

said means for injecting said at least one test signal is adapted to operate at more than one test frequency.

8. An apparatus for testing as defined in claim 7 wherein:

said means for injecting said at least one test signal is adapted to operate at said more than one test frequency and at more than one amplitude.

9. An apparatus for testing as defined in claim 5 wherein said means for injecting said at least one test frequency includes:

a plurality of radio frequency sources for coupling to said injection means; and means for switching said injection means along said plurality of sources.

10. An apparatus for testing as defined in claim 5 wherein said means for injecting said at least one test frequency includes:

a plurality of radio frequency sources for coupling to said second injection means; and means for switching said second injection means among said plurality of sources.

11. An apparatus for testing as defined in claim 7 wherein said means for injecting said at least one test signal includes:

a plurality of radio frequency sources for coupling to said cable assembly; and means for switching said cable assembly among said plurality of sources.

12. An apparatus for testing as defined in claim 2 wherein said comparing means includes:

a plurality of threshold signals, each corresponding to one of said injected test frequencies; and means for switching an associated threshold to said comparing means for corresponding injected test signal.

13. An apparatus for testing as defined in claim 9 wherein said comparing means includes:

a plurality of threshold signals, each corresponding to one of said injected test frequencies; and means for switching an associated threshold to said coupling means for a corresponding injected test signal.

14. An apparatus for testing as defined in claim 10 wherein said comparing means includes:

a plurality of threshold signals, each corresponding to one of said injected test frequencies; and means for switching an associated threshold to said comparing means for a corresponding injected test signal.

15. A method of testing the shielding effectiveness over a frequency range of at least one cable end of a cable assembly comprising a cable portion terminated on either cable end by a connector, comprising the steps of:

selecting at least one test frequency which is representative of the range of frequencies over which the effectiveness is to be tested;

selecting at least one reference level for said at least one test frequency which is representative of the attenuation characteristic desired for said cable assemblies;

injecting said at least one cable end with said test frequency;

measuring a power level radiated from a localized area of said at least one cable end of the cable assembly; and comparing the measured power level with the reference level and generating a pass signal if the measured power is less than said reference level and a fail signal is the measured power is greater than said reference level.

16. A method as defined in claim 15 wherein said step of selecting at least one test frequency includes:

selecting several test frequencies which define a characteristic attenuation curve for said cable assembly and for which radiated power levels of all major failure modes of said cable assembly will exceed at least one of said reference power levels at said test frequencies.

17. A method as defined in claim 16 wherein said step of selecting at least one reference level includes:

measuring the power level radiated from an unshielded cable end of a referenee cable assembly of the same construction as said tested cable assembly;

providing the desired attenuation specification for said cable assembly; and storing said reference level as the sum of said unshielded power level and said attenuation specification.

18. A test fixture for testing at least one cable end of a cable assembly including a cable portion with one or more cable ends, each cable end being terminated by a connector, said fixture adapted to electrically isolate said at least one cable end from the cable portion and thereby from the other cable ends of the cable assembly, comprising:

a first isolation means, generally in the shape of a half annulus, for receiving the cable portion of said cable assembly;

a second isolation means, generally in the shape of a half annulus, adapted to be clamped to said first isolation means to form a closed annulus which surrounds part of the cable portion of said cable assembly;

means for measuring a radiated power level from said at least one cable end, said measuring means being located between said first and second isolation means and the respective connector terminating said at least one cable end;

means for mounting said first and second isolation means and for clamping said second isolation means to said first isolation means; and said first and second isolation means being comprised of a material which will attenuate electromagnetic standing waves being transmitted along said cable portion of said cable assembly thereby electrically isolating said at least one cable end.

19. A test fixture as set forth in claim 18 for testing another cable end of said cable assembly, which further includes:

a third isolation means, generally in the shape of a half annulus, for receiving the cable portion of said cable assembly;

a fourth isolation means, generally in the shape of a half annulus, adapted to be clamped to said third isolation means to form a closed annulus which surrounds part of the cable portion of said cable assembly;

means for measuring radiated power levels of said another cable end, said measuring means being located between said third and said fourth isolation means and the respective connector terminating said another cable end;

means for mounting said third and fourth means and for clamping said fourth isolation means to said third isolation means; and said third and fourth isolation means being comprised of a material which will attenuate electromagnetic standing wabes from being transmitted along the outside of said cable portion of said cable assembly thereby electrically isolating said another cable end.

* * * * *

UNITED STATES PATENT AND TRADEMARK OFFICE
CERTIFICATE OF CORRECTION

PATENT NO. : 4,647,844        Page 1 of 3

DATED     : March 3, 1987

INVENTOR(S) : Robert J. Biegon, et al.

It is certified that error appears in the above-identified patent and that said Letters Patent is hereby corrected as shown below:

ABSTRACT, Line 11, delete "either" (first occurrence).

Column 1, Line 52, Change "guarantying" to --guaranteeing--.

Column 1, Line 68, Change "a" to --an--.

Column 2, Line 8, Delete "been" (first occurrence).

Column 2, Line 11, Change "Grey" to --Gray--.

Column 2, Line 21, Change "include" to --includes--.

Column 2, Line 52, Change "an" to --a--.

Column 4, Line 1, After "is" insert --a--.

Column 4, Line 47, Change "the" to --a--.

Column 5, Line 9, Change "Schaumberg" to --Schaumburg--.

Column 5, Line 61, After "the" delete "described".

Column 5, Line 62, After "the" insert --described--.

Column 6, Line 4, Delete "at".

Column 6, Line 23, Change "text" to --test--.

Column 6, Line 24, After "closed" insert --,-- (comma).

Column 6, Line 52, Delete "in an".

Column 7, Line 65, Change "insures" to --ensures--.

Column 8, Line 65, After "all" insert --the--.

UNITED STATES PATENT AND TRADEMARK OFFICE
CERTIFICATE OF CORRECTION

PATENT NO. : 4,647,844

DATED : March 3, 1987

INVENTOR(S) : Robert J. Biegon, et al.

It is certified that error appears in the above-identified patent and that said Letters Patent is hereby corrected as shown below:

Column 9, Line 42, Change "7 segment" to --7-segment--.
Column 10, Line 63, Change "insure" to --ensure--.
Column 11, Line 36, Change "programs" to --program--.
Column 12, Line 61, Change "insure" to --ensure--.
Column 13, Line 11, Change "a" to --an--.
Column 13, Line 27, Change "With" to --with--.
Column 13, Line 41, Change "display" to --displayed--.
Column 13, Line 44, Change "Block" to --block--.
Column 14, Line 56, Change "7 segment" to --7-segment--.
Column 15, Line 5, Change "7 segment" to --7-segment--.
Column 15, Line 16, Change "A22" to --A222--.
Column 15, Line 26, Change "7 segment" to --7-segment--.
Column 33, Line 66, Claim 9, "Change "along" to --among--.
Column 36, Line 22, Claim 19, After "fourth" insert --isolation--

UNITED STATES PATENT AND TRADEMARK OFFICE
CERTIFICATE OF CORRECTION

PATENT NO. : 4,647,844    Page 3 of 3
DATED : March 3, 1987
INVENTOR(S) : Robert J. Biegon, et al.

It is certified that error appears in the above-identified patent and that said Letters Patent is hereby corrected as shown below:

Column 36, Line 27, Claim 19, Change "wabes" to --waves--.

Column 1, Line 48, Change "electro-magnetic" to --electromagnetic--.

Signed and Sealed this

Twenty-fifth Day of August, 1987

Attest:

DONALD J. QUIGG

Attesting Officer    Commissioner of Patents and Trademarks